United States Patent
Urashima et al.

(10) Patent No.: US 6,852,161 B2
(45) Date of Patent: Feb. 8, 2005

(54) METHOD OF FABRICATING GROUP-III NITRIDE SEMICONDUCTOR CRYSTAL, METHOD OF FABRICATING GALLIUM NITRIDE-BASED COMPOUND SEMICONDUCTOR, GALLIUM NITRIDE-BASED COMPOUND SEMICONDUCTOR, GALLIUM NITRIDE-BASED COMPOUND SEMICONDUCTOR LIGHT-EMITTING DEVICE, AND LIGHT SOURCE USING THE SEMICONDUCTOR LIGHT-EMITTING DEVICE

(75) Inventors: Yasuhito Urashima, Chiba (JP); Mineo Okuyama, Chiba (JP); Tetsuo Sakurai, Chiba (JP); Hisayuki Miki, Chichibu (JP)

(73) Assignee: Showa Denko K.K., Tokyo (JP)

( * ) Notice: Subject to any disclaimer, the term of this patent is extended or adjusted under 35 U.S.C. 154(b) by 125 days.

(21) Appl. No.: 10/110,692

(22) PCT Filed: Aug. 17, 2001

(86) PCT No.: PCT/JP01/07080

§ 371 (c)(1),
(2), (4) Date: Apr. 17, 2002

(87) PCT Pub. No.: WO02/17369

PCT Pub. Date: Feb. 28, 2002

(65) Prior Publication Data

US 2002/0155712 A1 Oct. 24, 2002

Related U.S. Application Data

(60) Provisional application No. 60/269,852, filed on Feb. 21, 2001, provisional application No. 60/276,116, filed on Mar. 16, 2001, and provisional application No. 60/254,898, filed on Dec. 13, 2000.

(30) Foreign Application Priority Data

| Aug. 18, 2000 | (JP) | ................................. 2000-248106 |
| Aug. 23, 2000 | (JP) | ................................. 2000-252067 |
| Jan. 25, 2001 | (JP) | ................................. 2001-016636 |
| Feb. 23, 2001 | (JP) | ................................. 2001-048721 |

(51) Int. Cl.$^7$ .............................................. C30B 25/02
(52) U.S. Cl. ......................................................... 117/104
(58) Field of Search ........................... 117/88, 105, 104

(56) References Cited

U.S. PATENT DOCUMENTS 6,106,898 A * 8/2000 Takamatsu et al. ..... 427/255.21

FOREIGN PATENT DOCUMENTS

| JP | 2-229476 | 9/1990 |
| JP | 4-297023 | 10/1992 |

(List continued on next page.)

OTHER PUBLICATIONS

S. Haffouz et al., *The effect of the SiN treatment of a nitridated sapphire surface on the growth mode of GaN in low–pressure metalorganic vapor phase epitaxy*, Applied Physics letters, vol. 73, No. 9, pp. 1278–10280 (Aug. 1998).

(List continued on next page.)

*Primary Examiner*—Nadine G. Norton
*Assistant Examiner*—Matthew A. Anderson
(74) *Attorney, Agent, or Firm*—Sughrue Mion, PLLC

(57) ABSTRACT

A method of fabricating a film of group-III nitride semiconductor crystal includes a step of using metal material to deposit particles of a group III metal on a substrate surface in an atmosphere containing no nitrogen source, a step of nitriding the particles in an atmosphere containing a nitrogen source and no metal material, and a step of growing group-III nitride semiconductor crystal on the substrate surface on which the particles have been deposited.

84 Claims, 8 Drawing Sheets

FOREIGN PATENT DOCUMENTS

| | | | | |
|---|---|---|---|---|
| JP | 7-263346 | | 10/1995 | |
| JP | 7-273367 | | 10/1995 | |
| JP | 09-134878 | * | 5/1997 | ........... C30B/29/38 |
| JP | 9-148626 | | 6/1997 | |
| JP | 11-261169 | | 9/1999 | |
| JP | 11-274563 | | 10/1999 | |
| JP | 2000-049092 | | 2/2000 | |
| JP | 2000-068559 | | 3/2000 | |

OTHER PUBLICATIONS

Takahiro Ito et al., *Effect of AlN buffer layer deposition conditions on the properties of GaN layer*, Journal of Crystal Growth, 205 (1999) 20–24.

Korean Office Action for Korean Patent Application No. 10–2002–7004863 dated Jun. 29, 2004.

* cited by examiner

METHOD OF FABRICATING GROUP-III NITRIDE SEMICONDUCTOR CRYSTAL, METHOD OF FABRICATING GALLIUM NITRIDE-BASED COMPOUND SEMICONDUCTOR, GALLIUM NITRIDE-BASED COMPOUND SEMICONDUCTOR, GALLIUM NITRIDE-BASED COMPOUND SEMICONDUCTOR LIGHT-EMITTING DEVICE, AND LIGHT SOURCE USING THE SEMICONDUCTOR LIGHT-EMITTING DEVICE

This application claims benefit of Application Nos. 60/254,895, 60/254,898, 60/269,852, and 60/276,116 filed Dec. 13, 2000, Dec. 13, 2000, Feb. 21, 2001, and Mar. 16, 2001, the disclosures of which are incorporated herein by reference.

FIELD OF ART

This invention relates to a method of fabricating a group-III nitride semiconductor crystal that can be used for fabricating a light-emitting diode (LED), a laser diode (LD), an electronic device and the like, a method of fabricating a gallium nitride-based compound semiconductor, a gallium nitride-based compound semiconductor, a gallium nitride-based compound semiconductor light-emitting device and a light source using the semiconductor light-emitting device.

BACKGROUND ART

Because they have a direct-transition type bandgap energy extending from visible light to ultraviolet that makes it possible to emit light with high efficiency, group-III nitride semiconductors are used for LEDs and LDs. At heterojunction interfaces with aluminum gallium nitride (AlGaN) and gallium nitride (GaN), the manifestation of a two-dimensional layer of electrons due to a characteristic piezoelectric effect of group-III nitride semiconductors is among potential characteristics of such semiconductors that cannot be obtained by conventional group III-V compound semiconductors.

However, a nitrogen dissociation pressure that at single-crystal growth temperatures can reach 2000 atm. makes it difficult to grow group III compound semiconductor single crystal. Currently, it is therefore difficult to utilize a single-crystal substrate of such a group-III nitride semiconductor as a substrate for epitaxial growth of other group III-V compound semiconductors. Thus, as an epitaxial growth substrate, there are used substrates of different substances, such as sapphire ($Al_2O_3$) single-crystal or silicon carbide (SiC) single-crystal.

There is a large lattice mismatch between such a substrate and the group-III nitride compound semiconductor crystal that is epitaxially grown on the substrate. For example, there is a lattice mismatch of 16% between sapphire and gallium nitride and 6% between SiC and gallium nitride. Generally speaking, the existence of such a large mismatch makes it difficult to epitaxially grow the crystal directly on the substrate, and even when such growth is achieved, the crystallinity is not good. When the metallo-organic chemical vapor deposition (MOCVD) method is used to epitaxially grow group-III nitride semiconductor crystal on a single-crystal substrate of sapphire or SiC, as shown in JP-C 3,026,087 and JP-A HEI 4-297023, the method that is generally employed comprises first depositing on the substrate a layer of what is called a low-temperature buffer layer of aluminum nitride (AlN) or AlGaN, and then epitaxially growing the group-III nitride semiconductor crystal on the buffer layer.

In the case of a sapphire substrate, the above low-temperature buffer layer is formed as follows. First, the sapphire substrate is heated to 1000° C. to 1200° C. in an MOCVD epitaxial growth apparatus to remove any surface oxide film or the like. The system temperature is then reduced to around 400–600° C. and a metallo-organic material and nitrogen source are simultaneously supplied to the substrate to form by deposition a low-temperature buffer layer. The supply of metallo-organic material is then stopped and the temperature is again raised to effect heat treatment to crystallize the low-temperature buffer layer. This is followed by epitaxially growing the desired group-III nitride semiconductor crystal.

The 400° C. to 600° C. temperature at which the low-temperature buffer layer is formed by deposition is not high enough to thermally decompose the metallo-organic material or nitrogen source, especially ammonia used as a nitrogen source. As a result, in its as-deposited state, the low-temperature buffer layer contains many defects. Moreover, because the materials are reacted at a low temperature, there is a polymerization reaction with the alkyl group of the metallo-organic material and the nitrogen source that is not decomposed, producing impurities that are present in the low-temperature buffer layer in large quantities.

The above-described heat-treatment crystallization of the low-temperature buffer layer is done to eliminate such defects and impurities. The impurities and defects in the low-temperature buffer layer are eliminated by performing the heat treatment at a high temperature close to the temperature at which the group-III nitride semiconductor crystal is epitaxially grown on the low-temperature buffer layer.

As described above, forming the low-temperature buffer layer requires the step of depositing the buffer layer material at a low temperature and the step of crystallizing the layer at a high temperature. The fabrication conditions related to these steps have to be optimized in order to obtain a high-quality buffer layer. In the case of the low-temperature deposition of the buffer layer material, for example, the ratio between the metallo-organic material and the nitrogen source, the deposition temperature, the flow rate of the carrier gas and other such factors all have an effect on the properties of the buffer layer. And with respect to the crystallization step, factors affecting the properties of the buffer layer include the temperature at which the heat treatment is performed, the length of the heat treatment and the temperature elevation rate. The effects of these conditions on a low-temperature buffer layer of aluminum nitride were examined by Ito et al. in the Journal of Crystal Growth, 205 (1999), 20–24.

In order to obtain a high-quality low-temperature buffer layer, these conditions must each be carefully considered and efforts made to optimize them. Moreover, it is normally necessary to adjust these conditions with respect to each MOCVD apparatus used. Transplanting a set of optimized conditions from one apparatus to another requires a lot of time and work.

During the elevation of the temperature in the heat treatment used to crystallize the low-temperature buffer layer, the layer is changed by sublimation and recrystallization, giving rise to a structure in which nuclei of gallium nitride crystals are sparsely dispersed on the sapphire substrate surface. Gallium nitride-based compound semiconductor crystals grow from these nuclei, and under a suitable nuclei distribution density these crystals bond to form a crystalline film. That is, a layer of gallium nitride-based compound semiconductor having good crystallinity can be formed by suitably controlling the distribution density of the crystal nuclei.

However, the distribution structure of the crystal nuclei is determined only incidentally, by the thermal history during the heating phase and by the composition of the carrier gas during growth of the gallium nitride semiconductor layer. It is difficult to freely control the density, shape, size and other such properties of the crystal nuclei, which has limited the crystallinity of the gallium nitride-based compound semiconductors thus obtained.

An object of the present invention is to provide a simplified method of fabricating a group-III nitride semiconductor crystal that enables formation of a high-quality group-III nitride semiconductor crystal, in place of the above-described method of using a low-temperature buffer layer that requires the optimization of many fabrication conditions. More particularly, an object of the invention is to provide a method of fabricating a group-III nitride semiconductor crystal that enables high-quality group-III nitride semiconductor crystal to be epitaxially grown on a sapphire substrate by a simplified method. (Hereinbelow, the group-III nitride semiconductor is represented by $In_xGa_yAl_zN$, where $x+y+z=1$, $0 \leq x \leq 1$, $0 \leq y \leq 1$, $0 \leq z \leq 1$.)

Another object of the present invention is to provide a method of fabricating a gallium nitride-based compound semiconductor, and the gallium nitride-based compound semiconductor, that enables density, shape, size and other properties of crystal nuclei constituting a layer provided on a substrate to be freely controlled to impart good crystallinity thereto, and enables good crystallinity to be imparted to a crystal layer formed by deposition thereon.

Another object is to provide a light-emitting device and light source having good emission efficiency, low rate of degradation and low power-consumption, and which are also low-cost and require replacement at a low frequency.

DISCLOSURE OF THE INVENTION

The invention achieves the foregoing objects by providing a method of fabricating a group-III nitride semiconductor crystal according to a first aspect, comprising a first step of depositing particles of a group III metal on a substrate surface, a second step of nitriding the particles in an atmosphere containing a nitrogen source, and a third step of using a vapor phase growth method to grow group-III nitride semiconductor crystal represented by $In_xGa_yAl_zN$, where $x+y+z=1$, $0 \leq x \leq 1$, $0 \leq y \leq 1$, and $0 \leq z \leq 1$, on the substrate surface on which the particles have been deposited.

The above method encompasses a case in which the substrate is a sapphire ($Al_2O_3$) substrate.

The above method encompasses a case in which the group III metal is $In_uGa_vAl_w$, where $u+v+w=1$, $0 \leq u \leq 1$, $0 \leq v \leq 1$, $0 \leq w \leq 1$).

The above method encompasses a case in which deposition of the group III metal particles is by thermal decomposition of metallo-organic material.

The above method encompasses a case in which the first step is performed in an atmosphere in which there is no nitrogen source at or above a melting point of the group III metal.

The above method encompasses a case in which the second step is performed in an atmosphere in which there is no metal material at or above a temperature used in the first step.

The above method encompasses a case in which the third step is performed at a temperature that is not lower than a temperature used in the second step.

The above method encompasses a case in which the group-III nitride semiconductor crystal is formed by a metallo-organic chemical vapor deposition method.

The above method encompasses a case in which the group III metal particles nitrided in the second step are polycrystalline and/or noncrystalline group-III nitrides and also include unreacted metal.

In accordance with a second aspect of the invention, the foregoing objects are also attained by a method of fabricating a group-III nitride semiconductor crystal comprising a first step of, in an atmosphere not containing a nitrogen source, using thermal decomposition of metallo-organic material that includes at least one metal element selected from among In, Ga and Al to deposit on a sapphire substrate metal represented by $In_uGa_vAl_w$, where $u+v+w=1$, $0 \leq u \leq 1$, $0 \leq v \leq 1$ and $0 \leq w \leq 1$, comprised of one or more selected from among In, Ga and Al at a temperature T1 that is not lower than a melting point of the metal, a second step of nitriding the deposited metal at a temperature T2, where $T2 \geq T1$, in an atmosphere that does not contain metallo-organic material and does contain a nitrogen source, and a third step in which a metallo-organic chemical vapor deposition method is used to epitaxially grow, at a temperature T3, where $T3 \geq T2$, a group-III nitride semiconductor crystal on the sapphire substrate on which the metal has been deposited.

The above method encompasses a case in which the sapphire substrate has a (0001) plane having a vertical axis inclined from <0001> in a specific direction.

The above method encompasses a case in which the specific direction of the sapphire substrate is <1–100> and an angle of inclination from <0001> is from 0.2° to 15°.

The above method encompasses a case in which temperature T1 is not lower than 900° C. and temperature T3 is not lower than 1000° C.

The above method encompasses a case in which, in the first step, the thermal decomposition of the metallo-organic material takes place in a hydrogen atmosphere.

The above method encompasses a case in which the metal is deposited on the sapphire substrate not as a layer but as particles that are not less than 50 Å and not more than 1000 Å high.

The above method encompasses a case in which, in the second step, the metal that is nitrided comprises polycrystals that are in a region in which a stoichiometric ratio of nitrogen to metal is not 1:1, that is a region of $In_uGa_vAl_wN_k$, where $u+v+w=1$, $0 \leq u$, $v$, $w \leq 1$ and $0<k<1$.

In accordance with a third aspect, the method of fabricating a group-III nitride semiconductor crystal comprises a first step of supplying group III metal material to a heated substrate and depositing the group III metal material and/or decomposition products thereof on the substrate, a second step of then heat-treating the substrate in an atmosphere that contains a nitrogen source, and a third step of using the group III metal material and nitrogen source to grow a group-III nitride semiconductor crystal on the substrate by a vapor phase method.

The above method encompasses a case in which the group-III nitride semiconductor crystal grown on the substrate has a (0001) plane having a vertical axis inclined from <0001> in a specific direction.

The above method encompasses a case in which the specific direction of the inclination is <11–20> and an angle of inclination from <0001> is from 0.2° to 15°.

The invention achieves the foregoing objects by providing a method of fabricating a gallium nitride-based compound semiconductor by growing a gallium nitride-based compound semiconductor crystal layer on a substrate. In accordance with a first aspect, the method comprises a first step of adhering metal nuclei to the substrate, a second step of annealing the metal nuclei, a third step of forming growth nuclei by nitriding the annealed metal nuclei, and a fourth step of growing a gallium nitride-based compound on the substrate having the growth nuclei to form a layer of gallium nitride-based compound semiconductor crystal.

The above method encompasses a case in which the substrate is sapphire, and a case in which in the first step the metal nuclei are adhered to a heated substrate by flowing a source gas that contains metallo-organic vapor and does not contain a nitrogen source.

The above method encompasses a case in which the metallo-organic material vapor includes at least one member selected from among a metallo-organic material that contains gallium, a metallo-organic material that contains aluminum and a metallo-organic material that contains indium.

The above method encompasses a case in which, in the second step, annealing of the metal nuclei is performed by flowing just carrier gas that contains neither a nitrogen source nor metallo-organic material vapor.

The above method encompasses a case in which, in the third step, the metal nuclei are nitrided by flowing gas that contains a nitrogen source and does not contain metallo-organic material vapor.

The above method encompasses a case in which, in the fourth step, the gallium nitride-based compound semiconductor crystal is grown by flowing a gas that contains both a nitrogen source and a metallo-organic material, using a metallo-organic chemical vapor deposition method.

The above method encompasses a case in which a temperature at which the second step is performed is not lower than a temperature at which the first step is performed, a temperature at which the third step is performed is not lower than the temperature at which the second step is performed, and a temperature at which the fourth step is performed is not lower than the temperature at which the third step is performed.

The above method encompasses a case in which the third step is performed after alternating the first and second steps two or more times, or the fourth step is performed after repeating the first, second and third steps two or more times.

The above method encompasses a case in which the first step comprises two steps, which are a first-stage step of flowing a gas containing vapor of at least one member selected from among metallo-organic material containing aluminum, metallo-organic material containing gallium and metallo-organic material containing indium, and a second-stage step of flowing a gas containing vapor of a different metallo-organic material from that of the first-stage step.

The above method encompasses a case in which the second step is performed after alternating the first-stage and second-stage steps of the first step two or more times.

The above method encompasses a case in which the growth nuclei are substantially trapezoidal nitride semiconductor crystals having a flat apex that is parallel to the substrate and flat sides.

The above method encompasses a case in which a separate layer of gallium nitride-based compound semiconductor crystal is grown on the gallium nitride-based compound semiconductor crystal layer formed in the fourth step.

In accordance with a second aspect, the method of fabricating a gallium nitride-based compound semiconductor comprises a first step of adhering metal nuclei to a substrate in which the first step comprises two steps, which are a first-stage step of flowing a gas containing vapor of at least one member selected from among metallo-organic material containing aluminum, metallo-organic material containing gallium and metallo-organic material containing indium, and a second-stage step of flowing a gas containing vapor of a different metallo-organic material from that of the first-stage step, a second step of forming growth nuclei by nitriding the metal nuclei, and a third step of growing a gallium nitride-based compound on the substrate having the growth nuclei to form a layer of gallium nitride-based compound semiconductor crystal.

The above method encompasses a case in which the substrate is a sapphire substrate.

The above method encompasses a case in which the second step is performed after alternating the first-stage and second-stage steps of the first step two or more times and the third step is performed after alternating the first and second steps two or more times.

The above method further encompasses a case in which in the first step the metal nuclei are adhered to a heated substrate by flowing a gas that contains metallo-organic material vapor and does not contain a nitrogen source.

The above method encompasses a case in which, in the second step, the metal nuclei are nitrided by flowing a gas that contains a nitrogen source and does not contain metallo-organic material vapor.

The above method encompasses a case in which, in the third step, the gallium nitride-based compound semiconductor crystal is grown by flowing a gas that contains both a nitrogen source and a metallo-organic material, using a metallo-organic chemical vapor deposition method.

The above method encompasses a case in which a temperature at which the second step is performed is not lower than a temperature at which the first step is performed, and a temperature at which the third step is performed is not lower than the temperature at which the second step is performed.

The above method encompasses a case in which the growth nuclei are substantially trapezoidal group-III nitride semiconductor crystals having a flat apex that is parallel to the substrate and flat sides.

The above method encompasses a case in which a separate layer of gallium nitride-based compound semiconductor crystal is grown on the gallium nitride-based compound semiconductor crystal layer formed in the third step.

The invention also provides a gallium nitride-based compound semiconductor fabricated by the method of fabricating gallium nitride-based compound semiconductor according to the first, second and third aspects of the invention.

The invention also provides a gallium nitride-based compound semiconductor light-emitting device fabricated using the above gallium nitride-based compound semiconductor.

The invention also provides a light source fabricated using the above gallium nitride-based compound semiconductor light-emitting device.

The above method of fabricating gallium nitride-based compound semiconductor according to the first or second aspect also encompasses a step of forming on the substrate a mask layer to grow a gallium nitride-based compound semiconductor at a low growth rate, thereby selectively growing the gallium nitride-based compound semiconductor.

The above method encompasses the mask layer formation step being performed in a same epitaxial growth apparatus in which the gallium nitride-based compound semiconductor is grown.

The above method encompasses forming the mask layer on a heated substrate by flowing a Si-containing gaseous material.

The above method encompasses forming the mask layer on a heated substrate by simultaneously flowing a Si-containing gaseous material and ammonia.

The above method encompasses the mask layer formed so that a portion of the substrate is covered by material constituting the mask layer and a portion of the substrate is exposed.

The above method encompasses a case in which, in the first step, a gaseous material containing a group III element and a gaseous material containing Si are simultaneously flowed.

The above method also encompasses forming on the substrate a mask layer comprising a portion comprised of material on which gallium nitride-based compound semiconductor growth rate is low and a portion comprised of material on which gallium nitride-based compound semiconductor growth rate is high.

The above and other features of the present invention will become apparent from the following description made with reference to the drawings.

BEST MODE FOR WORKING THE INVENTION

Figure 1A:
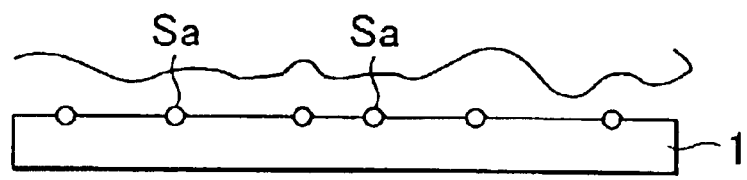
FIGS. 1(a), 1(b), 1(c), 1(d), 1(e) illustrate the growth mechanisms in the steps of forming a gallium nitride-based compound semiconductor layer on a substrate, in accordance with this invention.

The description starts with an explanation of a method of fabricating a group-III nitride semiconductor crystal according to a first aspect of the invention.

The method of fabricating a group-III nitride semiconductor crystal according to a first aspect comprises a first step of depositing particles of a group III metal on a substrate surface, followed by a second step of nitriding the particles in an atmosphere containing a nitrogen source, followed by a third step of growing group-III nitride semiconductor crystal.

The fabrication method comprised of the three steps enables group-III nitride semiconductor crystal having good crystallinity to be formed on the substrate. Moreover, this method readily enables the fabrication of high-quality group-III nitride semiconductor crystal without the rigorous control of fabrication conditions that is required by the prior art method that uses a low-temperature buffer layer. The group-III nitride semiconductor crystal referred to herein is represented by $In_xGa_yAl_zN$ (where $x+y+z=1$, $0 \leq x \leq 1$, $0 \leq y \leq 1$, $0 \leq z \leq 1$).

The substrate used in the above fabrication method may be glass, SiC, Si, GaAs, sapphire, or other such substances. Among the advantages of using a substrate of sapphire ($AL2O3$) are that it results in high-quality crystal and the material can be obtained at a low cost. In the case of sapphire, the planes that can be used include the m, a, and c planes. It is preferable to use the c plane ((0001) plane), and it is also desirable for the vertical axis of the substrate surface to be inclined from the <0001> direction. It is also preferable to subject the substrate to organic cleaning or etching or other such pre-treatment prior to using it in the first step, since this makes it possible to maintain the substrate surface in a constant state.

The group III metal particles deposited on the substrate in the first step may be particles of Al, Ga, In and the like. In this invention, it is desirable to use particles of $In_uGa_vAl_w$ (where $u+v+w=1$, $0 \leq u \leq 1$, $0 \leq v \leq 1$, $0 \leq w \leq 1$). The advantage of using $In_uGa_vAl_w$ is that it has good affinity with the group-III nitride semiconductor that is formed next. Impurities that can be added to the group III metal particles include Si, Be, Mg and other such non-group III metals. When decomposition of a metal compound is used to deposit a group III metal, the group III metal particles may contain impurities such as carbon, hydrogen and halogen, but these can also be used as the metal particles.

The particles can be deposited by various methods such as thermal decomposition of metallo-organic material or metal halogen compounds, vapor deposition, and sputtering. It is preferable to use thermal decomposition of metallo-organic material for deposition of the group III metal particles. As the metallo-organic material, there can be used compounds such as trimethyl gallium (TMG), triethyl gallium (TEG), trimethyl aluminum (TMA), trimethyl indium (TMI), and bicyclopentadienyl indium ($Cp_2In$). An advantage of using thermal decomposition of a metallo-organic material to deposit the group III metal particles is that it enables the deposition to be implemented in situ.

If the first step is performed in an atmosphere that contains a nitrogen source such as ammonia, it can give rise to problems such as inhibition of surface migration. For this reason, it is preferable to perform the first step in an atmosphere that does not contain a nitrogen source. $N_2$ gas, which is widely used as an inert carrier gas, is not thought of here as a nitrogen source. $N_2$ gas does not form an effective nitrogen source, since its decomposition temperature is higher than that of the usual nitrogen sources such as ammonia or hydrazine. Therefore, with respect to the first step in these methods, the effect is not inhibited by the inclusion of $N_2$ gas in the atmosphere. Gases that can be used include hydrogen, rare gases and nitrogen. It is desirable to carry out the first step at a temperature at or above the melting point of the group III metal, since this facilitates migration of metal atoms on the substrate.

Group III metal particles deposited on the substrate surface in the first step are deposited as a discontinuous distribution. The particles may bond in places. The deposition state of the particles on the substrate surface can be observed using an atomic force microscope (AFM). Group III metal particles formed in this first step are about 50 Å to 1000 Å high and about 100 Å to 10000 Å long from end to end, when viewed vertically from above, and the surface density of the particles ranges from around $1\times10^6$ cm$^{-2}$ to $1\times10^{10}$ cm$^{-2}$.

If the second step takes place in an atmosphere containing metal material, the crystallinity of the group-III nitride semiconductor crystal grown in the third step will be degraded, so the second step should be performed in an atmosphere that does not contain metal material. For the second step, an atmosphere can be used that contains ammonia or hydrazine as a nitrogen source. It is preferable to perform the second step under an atmospheric pressure of 1000 to $1\times10^5$ Pa. Sectional analysis using a tunneling electron microscope (TEM) shows that group III metal particles nitrided in the second step have a polycrystalline and/or noncrystalline structure and include unreacted metal.

It is desirable to perform the second step at a temperature that is not lower than the temperature at which the first step is performed. Experiments conducted by the inventors show that doing this makes it possible to fabricate group-III nitride semiconductor crystal having good crystallinity. To promote the particle nitriding reaction, it is preferable to perform the second step at or above 700° C., and more preferably, at or above 900° C. Nitriding of the group III metal particles in the second step can be implemented by maintaining the substrate on which the particles have been deposited for 1 to 10 minutes at or above 700° C. in an atmosphere containing a nitrogen source.

It is desirable to perform the third step at a temperature that is not lower than the temperature at which the second step is performed. Doing this is advantageous in that it imparts high quality to the group-III nitride semiconductor that is grown. Specifically, it is preferable to perform the third step at or above 700° C., and more preferably, at or above 900° C.

In the third step, the group-III nitride semiconductor crystal can be formed by various vapor phase growth methods including the metallo-organic chemical vapor deposition (MOCVD) method, the molecular beam epitaxy (MBE) method and the vapor phase epitaxy (VPE) method. Because it can be used to grow thin films, it is particularly desirable to use the MOCVD method to form group-III nitride semiconductor crystal. A known MOCVD method can be used to grow the layer in a gas containing metallo-organic material and a nitrogen source under a pressure in the order of 1000 to $1\times10^5$ Pa. It is known that gallium nitride-based compound semiconductor having good crystallinity can be obtained when the third step is performed using the MOCVD method at a temperature above 1000° C. This is considered to be due to the fact that, unlike at other temperatures, at or above 1000° C. the growth mode of the gallium nitride-based compound semiconductor becomes a strongly horizontal growth mode. In this case, it is possible to form crystal layers with a good surface morphology with low dislocation.

In the method of fabricating a group-III nitride semiconductor crystal according to a second aspect of the invention, in the first step, in an atmosphere not containing a nitrogen source, thermal decomposition of metallo-organic material that includes at least one metal element selected from among In, Ga and Al is used to deposit on a sapphire substrate a metal 1 (represented by $In_uGa_vAl_w$, where u+v+w=1, $0\leq u\leq 1$, $0\leq v\leq 1$, $0\leq w\leq 1$) comprised of one or more selected from among In, Ga and Al at a temperature T1 that is not lower than a melting point of the metal 1. This is followed by a second step of nitriding the metal 1 deposited at a temperature T2 (where T2≧T1) in an atmosphere that does not contain metallo-organic material and does contain a nitrogen source. This is followed by a third step in which the metallo-organic chemical vapor deposition method is used to epitaxially grow, at a temperature T3 (where T3≧T2), a group-III nitride semiconductor (represented by $In_xGa_yAl_zN$, where x+y+z=1, $0\leq x\leq 1$, $0\leq y\leq 1$, $0\leq z\leq 1$) crystal on the sapphire substrate on which the metal 1 has been deposited.

By means of the above method, group-III nitride semiconductor crystal having good crystallinity can be epitaxially grown on a sapphire substrate. Moreover, this method readily enables the fabrication of the high-quality group-III nitride semiconductor crystal without the rigorous control of fabrication conditions that is required by the prior art method using a low-temperature buffer layer.

The present inventors also discovered that the preferred step-flow growth of the group-III nitride semiconductor crystal could be reinforced by using a sapphire substrate with a (0001) plane in which the vertical axis of the (0001) plane was inclined in a specific direction from the <0001> direction. The step-flow growth is maximized when the specific direction of vertical axis inclination is <1–100> and the angle of inclination from <0001> is from 0.2° to 15°, so these can be used as conditions for fabricating high-quality group-III nitride semiconductor crystal.

For effective thermal decomposition of the metallo-organic material, it is preferable for temperature T1 to be at least 200° C. and also to be not lower than the melting point of the metal 1. A T1 of 900° C. or higher is more preferable to enable close to 100% of the metallo-organic material to be decomposed and to ensure that the deposited metal 1 is melted. Temperature T3 at which the group-III nitride semiconductor crystal is epitaxially grown should be at least 700° C., and more preferably at least 900° C. to ensure adequate decomposition of the nitrogen source.

It was confirmed by observation by atomic force microscopy that because the metal 1 is deposited at a temperature higher than the melting point, the surface tension causes the metal to form on the sapphire substrate as particles rather than as a layer. The metal 1 particles retain their shape even after the nitriding of the second step. It is considered that because the epitaxially growth of the group-III nitride semiconductor crystal proceeds using the particles as nuclei, it is possible to obtain group-III nitride semiconductor crystal having good crystallinity.

Sectional analysis using a tunneling electron microscope confirmed that group III metal particles nitrided in the second step are polycrystalline and the polycrystals are in a region in which the stoichiometric ratio of nitrogen to metal is not 1:1 (the composition of the region being represented by $In_uGa_vAl_wN_k$ where u+v+w=1, $0\leq u$, v, $w\leq 1$, 0<k<1). This is considered to be a difference rooted in the difference between the mode of growth in the case of the prior art in which a metallo-organic material and nitrogen source are simultaneously supplied to form a low-temperature buffer layer by low-temperature deposition followed by high-temperature heat treatment to crystallize the layer, and method of nitriding the metal 1 according to this invention.

In accordance with a third aspect, the method of fabricating a group-III nitride semiconductor crystal comprises a first step of supplying group III metal material to a heated substrate and depositing group III metal material and/or decomposition products thereof on the substrate, followed by a second step of heat treating the substrate in an atmosphere that contains a nitrogen source, followed by a third step of using the group III metal material and nitrogen source to grow a group-III nitride semiconductor on the substrate by a vapor phase method.

The metallo-organic material contained in the atmosphere used in the first step can be a metallo-organic compound, a metal halogen compound or a metal or the like. Of these, it is preferable to use a metallo-organic compound. In the first step, metallo-organic compounds of group III elements that can be used include trimethyl gallium (TMG), triethyl gallium (TEG), trimethyl aluminum (TMA), trimethyl indium (TMI), and bicyclopentadienyl indium (Cp$_2$In). Silane (SiH$_4$), disilane (Si$_2$H$_6$) and bicyclopentadienyl magnesium (Cp$_2$Mg) and the like can be added to the atmosphere for the purpose of doping with elements other than group III metals such as Si or Mg or the like.

In the first step, also, it is preferable for the atmosphere not to contain a nitrogen source. If a nitrogen source such as ammonia is included in the first step, the layer of gallium nitride-based compound semiconductor that is grown will not have a mirror surface morphology. This is as described in the prior art technology of JP-C 3026087 and JP-A-HEI 4-297023. N$_2$ gas is widely used as an inert carrier gas, but is not considered here as a nitrogen source. N$_2$ gas is not an effective nitrogen source, since its decomposition temperature is higher than that of the usual nitrogen sources such as ammonia or hydrazine. Therefore, with respect to the first step in the above methods, the effect is not greatly inhibited by the inclusion of N$_2$ gas in the atmosphere. Gases that can be used include hydrogen, nitrogen and rare gases.

Experiments conducted by the inventors show that performing the second step at or above the temperature at which the first step is performed makes it possible to fabricate group-III nitride semiconductor crystal having good crystallinity. Specifically, to promote the particle nitriding reaction it is preferable to perform the second step at or above 700° C., and more preferably at or above 900° C. Particularly good crystallinity can be obtained by using a temperature over 1000° C. It is desirable to use the MOCVD method for growing the group-III nitride semiconductor in the third step. Using this method makes it possible to use the same epitaxial reactor for the first to third steps. When the MOCVD method is used, 1000° C. or above is an ideal temperature to used for the third step. It is even better to use a temperature of 1100° C. or higher, since it facilitates obtaining mirror crystals. It is preferable to carry out the third step in an atmosphere that contains hydrogen, since this makes it easier to control the crystallinity and surface morphology.

As described in the foregoing, sapphire makes an ideal substrate. It is desirable to use a sapphire substrate having a (0001) plane in which the vertical axis is inclined from the <0001> direction in a specific direction. The preferred direction of this vertical axis inclination is <1–100> and the preferred angle of inclination from the <0001> direction is from 0.2° to 15°, as described above.

When a sapphire substrate is used that has a (0001) plane in which the vertical axis is inclined 0.2° to 15° from <0001> in the <1–100> direction, the group-III nitride semiconductor crystal grown on the substrate has a (0001) plane with a vertical axis inclined in the specific direction from the <0001) direction. Here, the specific direction of the surface inclination of the group-III nitride semiconductor crystal will be <11–20>, since the crystal grows at a rotation of 30° compared to the plane orientation of the substrate. Step-flow growth is reinforced when the tilt off <0001> is from 0.2° to 15°, which can be used as a condition for fabricating high-quality group-III nitride semiconductor crystal.

The method of fabrication can include a known heat treatment step prior to the first step known as thermal annealing. Thermal annealing, which is widely employed when sapphire substrates are used, is a type of cleaning treatment implemented in an epitaxial reactor. It usually involves heating the substrate at 1000° C. to 1200° C. in an atmosphere containing hydrogen or nitrogen.

In the method of fabrication, the first step can also be divided into a plurality of steps, with the type of metallo-organic material contained in the atmosphere, and the composition thereof as well as the mixture ratio thereof, being changed each time. Other conditions can also be changed, such as the temperature and the length of the substrate treatment. When the first step is divided into a plurality of steps, it is preferable that in the first of the steps the atmosphere contains a metallo-organic material that includes Al. This is because among group III metals, Al has a high melting point and readily bonds to the substrate.

A step of annealing in an atmosphere containing neither metal material nor a nitrogen source can be included between the first and second steps and/or between the second and third steps. The annealing promotes the distribution of the metal particles. Any such annealing should be performed at a temperature that is not lower than the melting point of the group III metal particles. The temperature should be at least 900° C., and more preferably at least 1000° C. The annealing should also be carried out in a hydrogen atmosphere.

The second step can be carried out while changing the temperature of the substrate. In this case too, the second step should be performed at or above the decomposition temperature of the nitrogen source. The second step should be performed at at least 700° C., more preferably at at least 900° C., and still more preferably at at least 1000° C. The second step starting temperature should be higher than the ending temperature. The second step can be started at the same temperature used for the first step, and can be ended at the same temperature at which the third step is performed. When the temperature is changed during the second step, the change can be accompanied by changes to the type of carrier gas used as well as the flow rate and the reactor pressure.

Details of the method of fabricating gallium nitride-based compound semiconductor according to the invention will now be explained, with reference to the drawings.

Figure 1B:
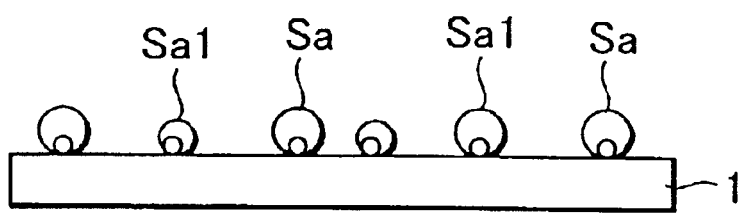
Figure 1C:
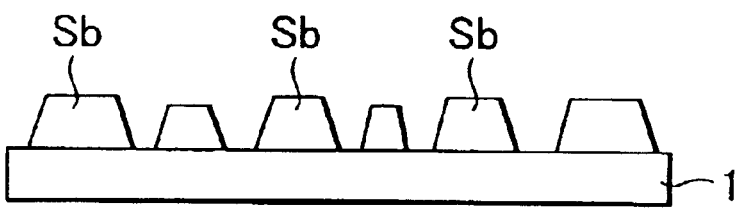
Figure 1D:
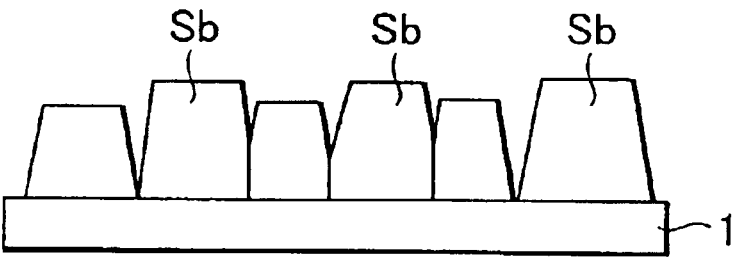
Figure 1E:
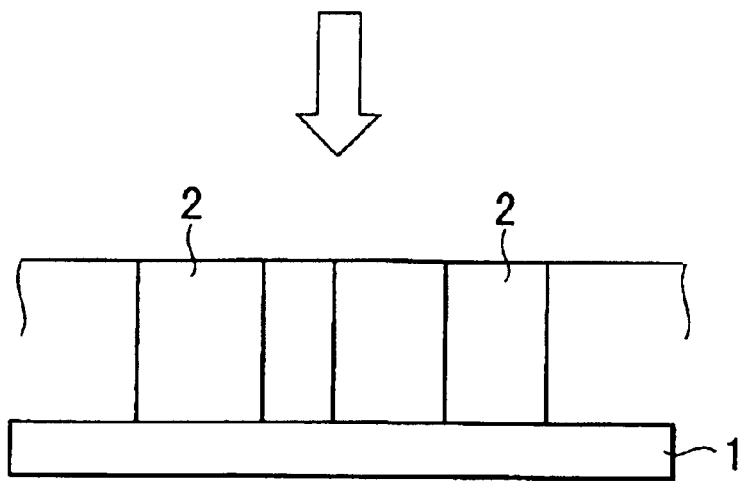
Figure 2:
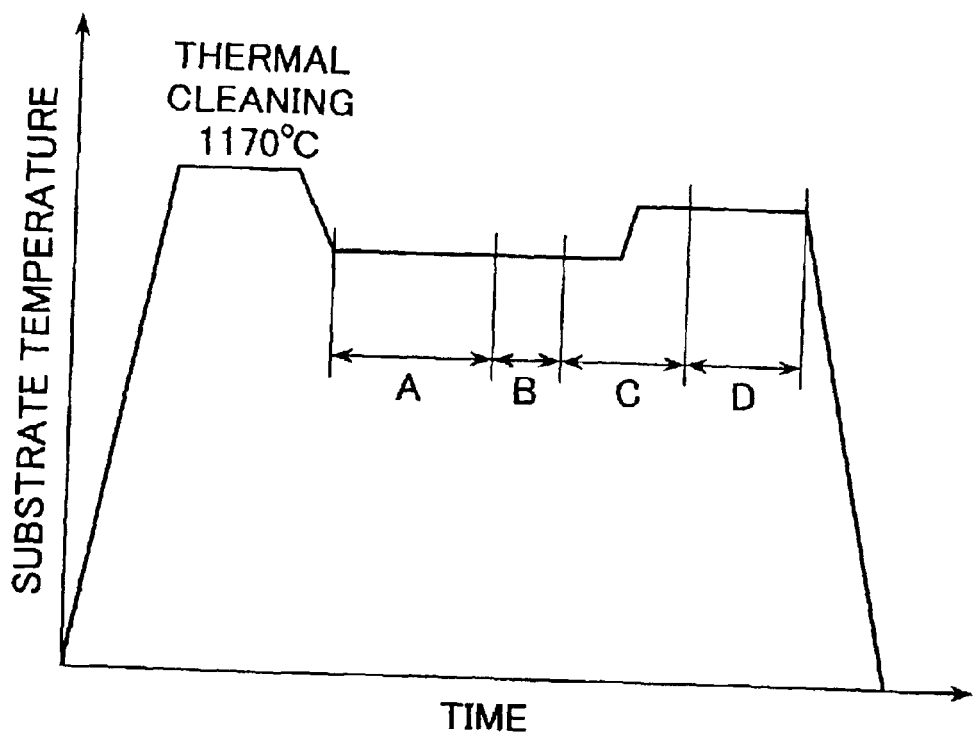
FIG. 2 shows an example of a heating pattern used during the formation of the layer of gallium nitride-based compound semiconductor on the substrate.

FIG. 1 illustrates the growth mechanisms in the steps of forming a layer of gallium nitride-based compound semiconductor, and FIG. 2 shows an example of a heating pattern used during the formation of the layer of gallium nitride-based compound semiconductor.

The following steps are used to form the layer of gallium nitride-based compound semiconductor on the substrate. As shown by FIG. 1(a), in step A (the first step), a metal element, preferably metal nuclei (droplets) Sa of a group III metal element are adhered to a substrate 1. At this stage the metal nuclei Sa do not have to be isolated, non-contiguous particles, but can be in the form of a liquid that covers the surface. Next, in step B (the second step), the metal nuclei Sa are annealed (FIG. 1(b)). Even if, in the first step, the particles were not in the required state of complete isolation, they are after the annealing. Next, in step C (the third step), the annealed metal nuclei Sa1 are nitrided to form growth nuclei Sb (FIG. 1(c)). No matter what shape the growth nuclei Sb are, as long as the have an appropriate distribution they are considered to function as growth nuclei. However, through experiments, the present inventors ascertained that the shape of the growth nuclei Sb does have an effect on the crystal properties of the gallium nitride-based compound semiconductor layer. Preferably, the group-III nitride semiconductor crystal should be substantially trapezoidal, with a flat top parallel to the substrate 1 and flat sides at a certain angle to the substrate 1. The growth nuclei Sb can be formed in the desired shape by, for example, paying due regard to the gas used during nitriding, the reactor pressure, the substrate temperature and the substrate heating pattern.

Instep D (the fourth step), a gallium nitride-based compound semiconductor layer is grown on the substrate 1 having the growth nuclei Sb (FIG. 1(d)). The growth proceeds horizontally, mostly accompanying the dislocation, ensuring an adequate layer depth (for example 2 $\mu$m), thereby providing a flat, horizontal layer of gallium nitride-based compound semiconductor 2 (FIG. 1(e)).

Steps A to D are taken continuously in an epitaxial growth apparatus by the MOCVD method. Before implementing step A, the substrate of, for example, sapphire is thermally cleaned inside the MOCVD apparatus at a temperature of 1000° C. to 1200° C., as shown in FIG. 2 (which shows 1170° C. as the temperature used). This is done to rid the substrate surface of any oxide film or the like. The temperature of the epitaxial growth apparatus is then reduced, for example to 5° C. to 200° C., and maintained at that temperature (1100° C. in the case of FIG. 2). Steps A, B and C are implemented at that temperature. Midway through the formation of the growth nuclei Sb by the nitriding process in step C, the temperature in the growth apparatus is raised and maintained at the elevated level (1160° C. in the case of FIG. 2): step D is performed at that temperature for further growth of gallium nitride-based compound on the growth nuclei Sb.

The steps described above and shown in FIG. 1 are an example of the method of the invention, which is not limited thereto. For example, thermal cleaning can be used if required. Similarly, the heating pattern is not limited to the one shown in FIG. 2, since it is desirable to use conditions suitable to the shape of the epitaxial reactor, the type of metallo-organic material, nitrogen source and carrier gas, the flow rate used, and other such factors. A different temperature can be used in each of the steps A, B and C, or different temperatures can be used for steps A and B, and steps B and C. Also, step D can be effected at a lower temperature than steps A to C, or at the same temperature.

Thus, in these examples of the invention, first metal nuclei Sa are adhered to the substrate 1, forming the basis for the growth nuclei Sb, which are used to grow the gallium nitride-based compound. The growth of the metal nuclei Sa adhered to the substrate 1 can be controlled by controlling the flow rate of the metallo-organic gas, the length of time the gas is flowed, the process temperatures used and so forth, to thereby control the density of the metal nuclei Sa on the substrate 1.

Annealing the metal nuclei Sa increases the perpendicular size of the metal nuclei Sa as a result of agglomeration arising from the wettability with the substrate (Sa1 in FIG. 1(b)), decreases adhesions by producing metal vapor in portions where there are no metal nuclei Sa, and forms a substrate surface in the exposed spaces between portions where Sa1 adhere. This makes it possible to control to a desired state the density of the growth nuclei Sb obtained from the nitriding. In particular, the gas used during the annealing and the temperature, pressure, duration and other such conditions are all effective with respect to controlling the density. These conditions have to be appropriately selected according to the type of metal used for the metal nuclei Sa that are adhered to the substrate, the shape of the reactor, and so forth. Based on experiments conducted by the present inventors, it is considered that the gas used should be hydrogen, the temperature should be at least 900° C. and the duration of the annealing should be not less than 5 minutes.

Next, the metal nuclei Sa1 are nitrided to transform them to growth nuclei Sb that form the nitride semiconductor. As mentioned, the growth nuclei Sb should be trapezoidal in shape, with a flat top parallel to the substrate 1 and flat sides. The shape of the growth nuclei Sb can be controlled by controlling the conditions used during the nitriding process. In particular, the gas used during the nitriding as well as the temperature and pressure and other such conditions are effective with respect to controlling the shape. These conditions have to be appropriately selected according to the type of metal used for the metal nuclei Sa that adhere to the substrate, the nitrogen material used for the nitriding, the shape of the reactor, and so forth. Based on experiments conducted by the present inventors, it is considered that the gas used should be hydrogen, the temperature should be at least 900° C. and the temperature should be raised between nitriding steps.

More gallium nitride-based compound semiconductor is grown on the growth nuclei Sb, so gallium nitride-based compound is grown to fill the spaces between adjacent growth nuclei Sb, forming a flat layer. Ultimately, it is therefore possible to form a layer of gallium nitride-based compound semiconductor 2 of a desired thickness and crystallinity.

The surface of this gallium nitride-based compound semiconductor layer is covered by a gallium nitride-based compound, making it possible to maintain very good lattice matching characteristics with the upper layer. As a result, by means of the gallium nitride-based compound semiconductor 2, it is possible to form on the substrate 1 layers of gallium nitride-based compound semiconductor each having good crystallinity. This improves the emission characteristics of a semiconductor light-emitting device fabricated using the gallium nitride-based compound semiconductor. A semiconductor light-emitting device fabricated by the above method can also be used in electronic equipment, vehicles, traffic signals and the like as a light source having good brightness and other such emission characteristics.

The substrate used in the above method may be glass, SiC, Si, GaAs, sapphire, and so forth. The advantages of using a substrate of sapphire (Al2O3) are high-quality crystal and the material can be obtained at low cost. In the case of sapphire, the m, a, and c planes are among the planes that can be used. Of these, it is preferable to use the c plane ((0001) plane). It is also preferable to subject the substrate to organic cleaning or etching or other such pre-treatment prior to using it in the first step, since this will make it possible to maintain the substrate surface in a constant state.

Metals that can be used for the metal nuclei adhered to the substrate in the first step include Al, Ga and In. In this invention, it is preferable to use nuclei of a group III metal represented by $In_u Ga_v Al_w$ (where u+v+w=1, $0 \leq u \leq 1$, $0 \leq v \leq 1$, $0 \leq w \leq 1$). $In_u Ga_v Al_w$ has the advantage of good affinity with the gallium nitride-based compound semiconductor that is formed next. Impurities that can be added to dope the group III metal particles include Si, Be, Mg and other such non-group III metals. When decomposition of a metal compound is used to deposit a group III metal, the group III metal particles may contain impurities such as carbon, hydrogen and halogen, which can also be used as metal nuclei.

The metal nuclei can be adhered to the substrate by various methods including thermal decomposition of metallo-organic material or metal halogen compounds, vapor deposition, and sputtering. In the case of this invention, it is preferable to use thermal decomposition of metallo-organic material, since it makes it easier to control the density and shape of the metal nuclei. Metallo-organic materials that can be used include trimethyl gallium (TMG), triethyl gallium (TEG), trimethyl aluminum (TMA), trimethyl indium (TMI), bicyclopentadienyl indium ($Cp_2In$). Using a metallo-organic material such as these that contains gallium, aluminum or indium makes it possible to adhere metal nuclei of a group III metal such as $In_uGa_vAl_w$.

Performing the first step in an atmosphere that contains a nitrogen source such as ammonia can give rise to problems such as inhibition of surface migration of metal atoms. It is therefore preferable to perform the first step in an atmosphere that does not contain a nitrogen source. Here, $N_2$ gas, which is widely used as an inert carrier gas, is not viewed as a nitrogen source. $N_2$ gas does not form an effective nitrogen source, since its decomposition temperature is higher than that of the usual nitrogen sources such as ammonia or hydrazine. Therefore, with respect to the first step in these methods, the effect is not inhibited by the inclusion of $N_2$ gas in the atmosphere. Gases that can be used include hydrogen, rare gases and nitrogen.

The first step should be carried out at a temperature that is not lower the melting point of the metal nuclei, as this facilitates the migration of metal atoms on the substrate. Metal nuclei deposited on the substrate surface in the first step are deposited as a discontinuous distribution. The particles can bond in places. The deposition state of the metal nuclei on the substrate surface can be observed using an atomic force microscope (AFM). This shows that the metal nuclei formed in the first step are about 50 Å to 1000 Å high and about 100 Å to 10000 Å long from end to end, when viewed vertically from above, and the surface density of the particles ranges from around $1\times10^6$ $cm^{-2}$ to $1\times10^{10}$ $cm^{-2}$.

With respect to the annealing step, it is preferable to anneal the metal nuclei using a carrier gas containing neither nitrogen source nor metallo-organic material, since this efficiently agglomerates the nuclei. Hydrogen, rare gases and nitrogen are all gases that can be used as the carrier gas, but it is best to use hydrogen, which has the effect of removing oxides from the surface of the metal nuclei. Annealing of the metal nuclei should be effected at a temperature that is not lower than the melting point of the metal nuclei and is also not lower than 700° C., since this efficiently agglomerates the nuclei.

The annealing should be done at a temperature that is not lower than the temperature at which the first step is performed. Experiments conducted by the inventors show that doing this enables fabrication of gallium nitride-based compound semiconductor crystal having good crystallinity. Even when the annealing is effected at the same temperature used in the first step, it results in good crystallinity and makes it easier to use the system apparatus to control conditions inside the reactor.

If the step of nitriding the metal nuclei takes place in an atmosphere containing metal material, the crystallinity of the gallium nitride-based compound semiconductor grown in the following step will be degraded. Therefore, the nitriding step should be performed in an atmosphere that does not contain metal material. In the case of this invention, as the nitrogen-source-containing atmosphere in which the metal nuclei are nitrided, there can be used an atmosphere containing ammonia or hydrazine. This step should be performed under a pressure of 1000 to $1\times10^5$ Pa. Sectional analysis using a tunneling electron microscope (TEM) shows that growth nuclei formed by the nitriding of the metal nuclei in the above nitriding step are polycrystalline and/or noncrystalline, and include unreacted metal.

To promote the metal nuclei nitriding reaction, the nitriding step should be performed at or above 700° C., and more preferably at or above 900° C., in order to fabricate gallium nitride-based compound semiconductor crystal having good crystallinity. Formation of growth nuclei by nitriding of the metal nuclei can be effected by maintaining the substrate on which the metal nuclei have been deposited for 1 to 10 minutes at or above 700° C. in an atmosphere containing a nitrogen source.

The nitriding step should be done at a temperature that is not lower than the temperature of the annealing step, since doing this makes it possible to fabricate gallium nitride-based compound semiconductor crystal having good crystallinity. Even when the nitriding is performed at the same temperature as the annealing, the result is gallium nitride-based compound semiconductor having good crystallinity, and it also makes it easier to use the system apparatus to control conditions inside the reactor.

Performing the step of growing gallium nitride-based compound semiconductor on the substrate with the growth nuclei at not lower than 700° C., and more preferably not lower than 900° C., is advantageous in that it enables the growth of high-quality gallium nitride-based compound semiconductor. The step of growing the gallium nitride-based compound semiconductor can be taken by various vapor phase growth methods including the metalorganic chemical vapor deposition (MOCVD) method, the molecular beam epitaxy (MBE) method and the vapor phase epitaxy (VPE) method. Because it can be used to grow thin films, it is particularly preferable to use the MOCVD method. For this invention, a known MOCVD method can be used to grow semiconductor in an atmosphere containing a metallo-organic compound and a nitrogen source under a pressure in the order of 1000 to $1\times10^5$ Pa.

The step of growing the gallium nitride-based compound semiconductor should be done at a temperature that is not lower than the temperature at which the nitriding step is performed. Experiments conducted by the inventors show that this enables fabrication of gallium nitride-based compound semiconductor crystal having good crystallinity. Even when the step of growing the compound semiconductor is taken at the same temperature as the nitriding step, it results in good crystallinity and makes it easier to use the system apparatus to control conditions inside the reactor.

The foregoing explanation was made with reference to the adhering of metal nuclei Sa on the substrate 1 and annealing the metal nuclei Sa. However, repeated adhering of metal nuclei Sa can be used instead of the annealing. Repeated adhering of the metal nuclei Sa can be used to control the density of the growth nuclei Sb formed in step C. In this case, in the first-stage step of adhering the first metal nuclei and the second-stage step of adhering metal nuclei the second time, controlling the density and shape of the growth nuclei Sb is facilitated by selecting the flowing materials according to the adhesiveness to the substrate 1. For this invention, it is preferable to use as the first-stage step a step of flowing a gas containing vapor of at least one member selected from among metallo-organic material containing aluminum, metallo-organic material containing gallium and metallo-organic material containing indium, and to use as the second-stage step a step of flowing gas containing vapor of a different metallo-organic material from that of the first-stage step. In this case, in the first-stage step, for example, material can be flowed that contains Al, which bonds well to the substrate, in order to form metal nuclei Sa on the substrate at a prescribed density, and in the second-stage step material that does not bond well such as Ga or In can be flowed to fabricate metal nuclei Sa, creating a structure in which the Ga or In is around the Al. Although the first-stage and second-stage steps can be alternated one time each, the use of two or more alternations is preferable.

This is followed by the nitriding used to form the growth nuclei, without any annealing. Here too, well-shaped growth nuclei Sb can be formed by proper control of the nitriding, the same as when annealing is used to control the density of the metal nuclei Sa1. As in the case of annealing, the gas used during the nitriding, temperature and pressure are conditions that affect the shape control. These conditions have to be properly selected according to the material of the metal nuclei Sa, the nitrogen material used in the nitriding, the shape of the reactor, and so forth. Based on experiments conducted by the present inventors, it is considered that the gas used should be hydrogen, the temperature should be at least 900° C. and the temperature should be increased during the nitriding steps.

In this case too, the step of growing the gallium nitride-based compound semiconductor should be done at a temperature that is not lower than the nitriding temperature. Experiments conducted by the inventors show that this enables fabrication of gallium nitride-based compound semiconductor crystal with good crystallinity. Even when the gallium nitride-based compound semiconductor crystal is grown at the same temperature used for the nitriding, the result is still good crystallinity, and it also makes it easier to use the system apparatus to control conditions inside the reactor.

As described in the above, in the method of fabricating gallium nitride-based compound semiconductor according to this invention, metal nuclei are adhered to the substrate and grown. Films with excellent crystal properties can be formed by using a sapphire substrate on which is formed a low-growth-rate mask layer of gallium nitride-based compound semiconductor crystal and selectively growing the gallium nitride-based compound semiconductor.

FIGS. 9(a) to 9(g) will be used to describe the mechanism of forming a film of gallium nitride-based compound semiconductor having good crystallinity.

Figure 9A:
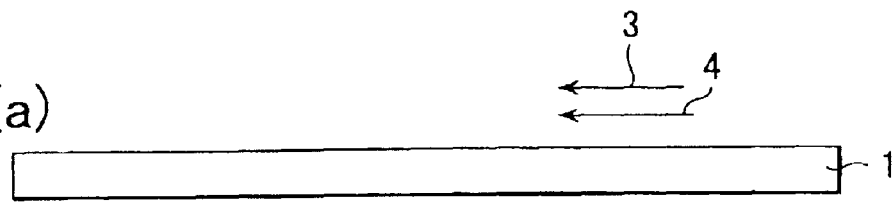
FIGS. 9(a), 9(b), 9(c), 9(d), 9(e), 9(f), 9(g) illustrate an example of the growth state at each step of the formation of a gallium nitride-based compound semiconductor layer formed on a substrate, using a mask layer.
Figure 9B:
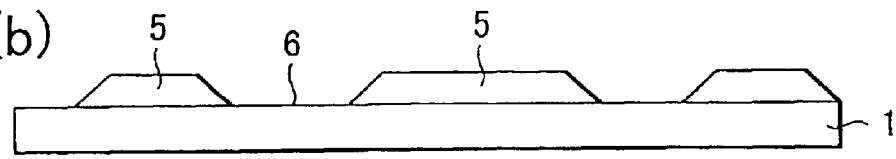
Figure 9C:
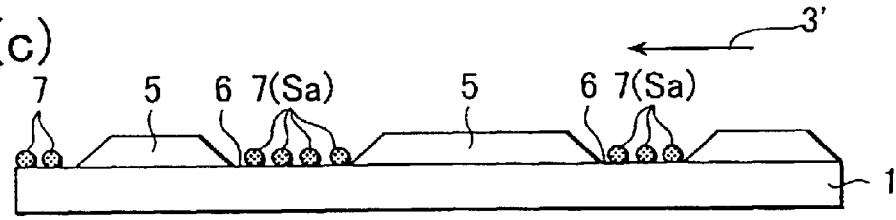
Figure 9D:
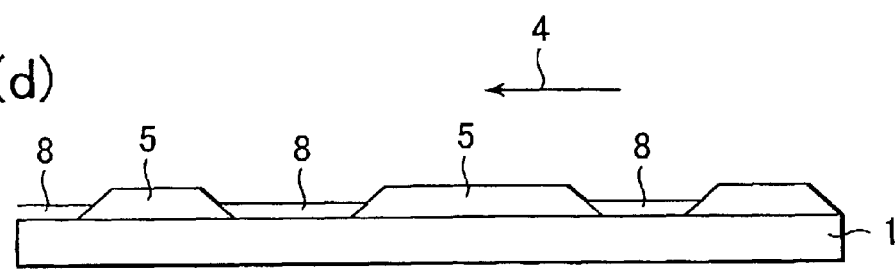
Figure 9E:
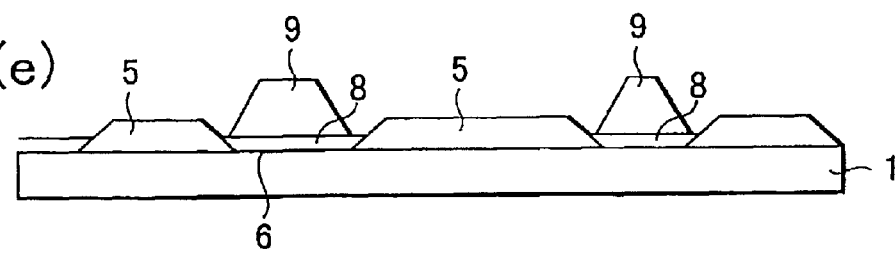
Figure 9F:
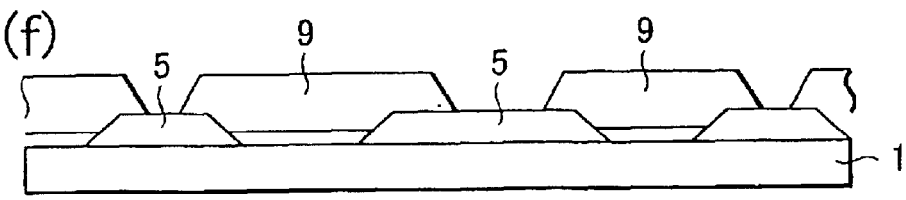
Figure 9G:
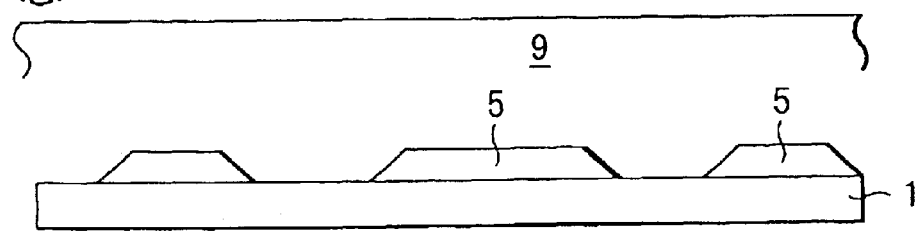
Figure 10A:
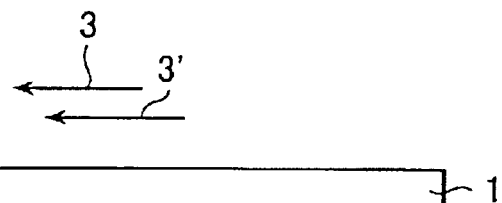
FIGS. 10(a), 10(b), 10(c), 10(d), 10(e), 10(f) illustrate an example of the growth state at each step of the formation of a gallium nitride-based compound semiconductor layer on a substrate, using a mask layer.
Figure 10B:
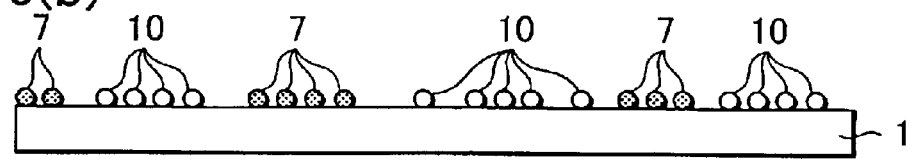
Figure 10C:
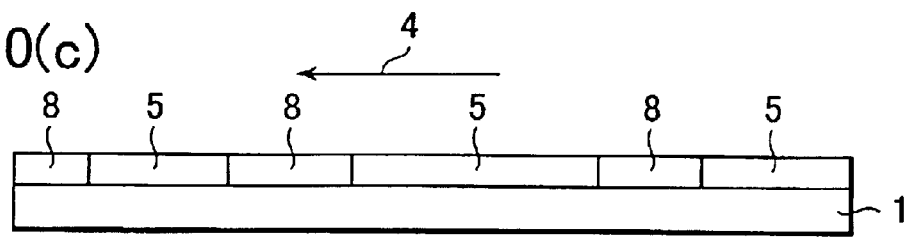
Figure 10D:
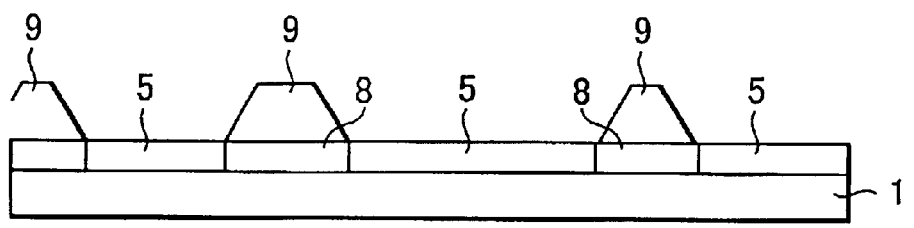
Figure 10E:
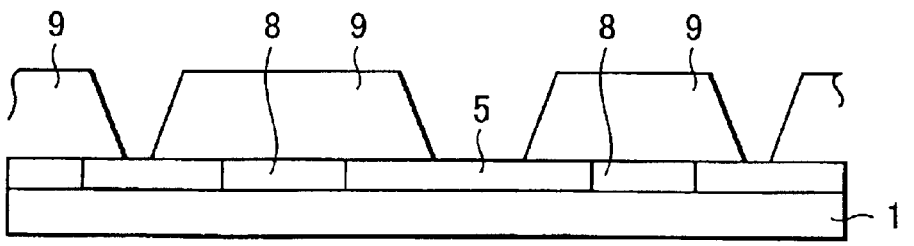
Figure 10F:
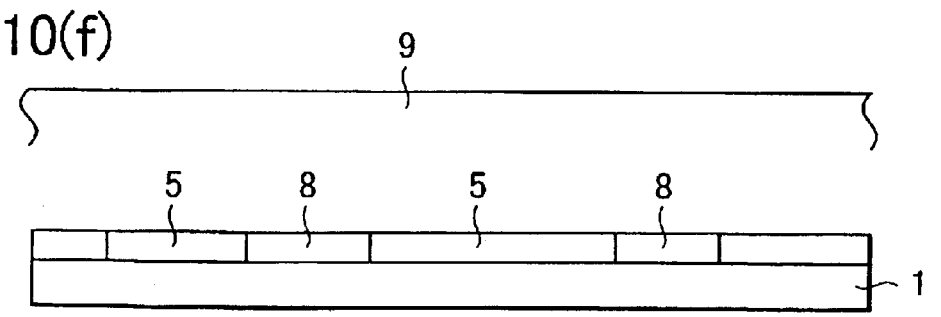

As shown in FIG. 9(a), source gas 3 containing Si and ammonia gas 4 are flowed to react the two compounds and form a silicon nitride film 5 on the sapphire substrate 1 heated to a prescribed temperature. Because the formation of the film 5 starts from active points scattered across the substrate, initially the film 5 does not uniformly cover the whole substrate. The growth time is controlled so that on the substrate 1, there are regions covered by the silicon nitride film 5 and regions 6 where the sapphire is exposed (FIG. 9(b)). Continuing on, after droplet-shaped particles 7 of a group III element are supplied to the regions 6 by flowing group III material gas 3' (FIG. 9(c)), ammonia is flowed to effect a reaction that produces group-III nitrides 8 in the regions 6 (FIG. 9(d)). Thus, growth nuclei in the regions covered by the silicon nitride film 5 do not generate growth, while crystals 9 do grow from the regions 6 where the sapphire is exposed, with the growth proceeding horizontally over the silicon nitride film 5 (FIG. 9(f)). As a result, the crystals 9 cover the entire surface of the sapphire substrate 1 (FIG. 9(g)). The growth direction of threading dislocations arising from differences in the lattice constants of the sapphire and gallium nitride-based compound semiconductor can be controlled, with most of the dislocations forming a closed loop and not propagating upwards. This reduces the density of threading dislocations, resulting in the formation of good-quality crystal.

The mask layer can be fabricated by a method in which Si source gas is flowed simultaneously with a nitrogen source gas such as ammonia, and by a method in which ammonia is flowed beforehand to partially nitride the sapphire surface, then the Si source gas is flowed to fabricate a scattered 1 mono layer of silicon nitride that is used to form the mask layer. When a layer of silicon oxide is formed to use as a mask layer, thermal cleaning can be used to activate oxygen atoms on the sapphire surface, and Si source gas can then be flowed to form a 1 mono layer of silicon oxide.

An effective method of forming a layer on a sapphire substrate at different growth rates is to simultaneously flow Si source gas and a group III source gas over a heated sapphire substrate, and then flowing ammonia gas. FIGS. 10(a) to 10(f) show the growth process in the case of this method. First, Si source gas 3 and group III material gas 3' are flowed over a heated substrate 1 (FIG. 10(a)). The gases decompose, and aggregations 10 of silicon atoms and droplet-shaped particles 7 of group III metal adhere to the sapphire substrate 1 at a set spacing (FIG. 10(b)). Each of these is then nitrided by flowing ammonia gas 4, resulting in the formation on the substrate 1 of a mask layer comprised of a slow-growth portion 5 of silicon oxide and a rapid-growth portion 8 of gallium nitride-based compound semiconductor (FIG. 10(c)). When gallium nitride-based compound semiconductor 9 is grown on this mask layer, as in the case of the example of FIG. 9, crystals 9 selectively grow on the gallium nitride-based compound semiconductor film 8. This selective growth improves the crystallinity.

In the case of the methods described with reference to FIGS. 9 and 10, processing and growth following formation of the mask layer have to be done at a temperature of at least 1000° C. This is because at a lower temperature such as 600° C., there will be insufficient migration during the formation of the group III metal particles 7 and the gallium nitride-based compound semiconductor film 8. As a result, growth nuclei will start to grow even in regions of the substrate 1 and buffer layer covered by the silicon oxide and silicon nitride, degrading the selective growth properties. Even when a layer of gallium nitride-based compound semiconductor 9 is formed on this mask layer, at a low temperature such as 600° C. there will be insufficient migration during the initial growth phase, so the growth nuclei will start to grow even in the regions of the substrate 1 and buffer layer covered by the silicon oxide and silicon nitride, degrading the selective growth properties. Silane ($SiH_4$) and disilane ($Si_2H_6$) can be used as a Si source gas. The step of forming the mask layer can be performed in the growth apparatus used for the following growth of the gallium nitride-based compound semiconductor.

As described in the foregoing, in accordance with this invention, a semiconductor crystal film having crystallinity that is good enough for semiconductor device applications can be obtained by including a step of flowing metallo-organic material over a heated substrate, to thereby grow gallium nitride-based compound semiconductor on the substrate. The film thus obtained has a flat, mirror surface, and better crystallinity than a film obtained by the low-temperature buffer layer method. Current leakage from pitting defects arising in the crystal growth, degradation of emission intensity caused by dislocations and other such manifestations that are disadvantageous for semiconductor devices can be suppressed, improving emission output.

In the following, specific examples of the methods of fabricating group-III nitride semiconductor crystal and gallium nitride-based compound semiconductor are described. However, the invention is not limited to these examples. Each of the following examples uses a sapphire substrate and uses the MOCVD method to form the gallium nitride-based compound semiconductor layers.

EXAMPLE 1

An embodiment of the method of fabricating group-III nitride semiconductor crystal will now be described. The substrate used was a sapphire single-crystal substrate having a (0001) plane. The substrate was organically cleaned with acetone and placed on a silicon carbide (SiC) susceptor, which was then placed in the MOCVD apparatus. An RF induction heating system was used to control the temperature in the MOCVD apparatus. A thermocouple enclosed in a quartz tube was inserted into the susceptor to enable growth temperatures to be measured in the apparatus.

After the substrate was positioned in the apparatus, it was heated to 1180° C. in a hydrogen atmosphere and held at that temperature for 10 minutes to remove any oxide film from the substrate surface. The temperature was then reduced to 1100° C., and in the same hydrogen atmosphere not containing a nitrogen source, a metallo-organic material, trimethyl aluminum (TMA), was supplied to the substrate for 1 minute at a flow rate of 12 $\mu$mol/min. The TMA was thus thermally decomposed, resulting in the deposition of Al on the sapphire substrate. After shutting off the TMA, the temperature was raised to 1180° C. and a nitrogen source, in the form of ammonia (NH$_3$) was supplied for 3 minutes at a flow rate of 0.2 mol/min, nitriding the Al. Then, with the NH$_3$ flow rate unchanged and the temperature maintained at 1180° C., a metallo-organic material, trimethyl gallium (TMG), was supplied at a flow rate of 140 $\mu$mol/min to effect epitaxial growth of a 1.1 $\mu$m layer of gallium nitride on the substrate with the Al deposition. The apparatus was then allowed to cool to room temperature and the substrate was removed from the reactor.

The epitaxial wafer thus fabricated had a mirror surface, and the peak width at half height of the X-ray rocking curve of the epitaxial layer of gallium nitride was 959 seconds. This shows the excellent crystallinity of the epitaxial layer.

EXAMPLE 2

As in the case of Example 1, a sapphire single-crystal substrate with a (0001) plane was organically cleaned and heat-treated in the growth apparatus. With the substrate then maintained at 1180° C. in a hydrogen atmosphere not containing a nitrogen source, it was supplied with TMA and TMG for 1 minute at a flow rate of 12 $\mu$mol/min, depositing an alloy of Al and Ga on the sapphire substrate. The TMA and TMG were shut off and, with the temperature maintained at 1180° C., ammonia was supplied for 3 minutes at a flow rate of 0.2 mol/min to nitride the Al—Ga alloy. Then, with the ammonia being supplied and the temperature still maintained at 1180° C., a metallo-organic material, trimethyl gallium (TMG), was supplied at a flow rate of 140 $\mu$mol/min to effect epitaxial growth of a 1.1 $\mu$m layer of gallium nitride on the substrate with the Al—Ga alloy deposition.

The epitaxial wafer thus fabricated had a mirror surface, and the peak width at half height of the X-ray rocking curve of the epitaxial layer of gallium nitride was 720 seconds, indicating the excellent crystallinity of the epitaxial layer. Examination of the surface of the gallium nitride layer by an atomic force microscope revealed terraces of atomic steps indicating step-flow growth. These atomic-step terraces showed more uniform spacing and parallelism, going in a particular direction from the center of the epitaxial wafer to the periphery. This signifies that the step-flow growth is reinforced at (0001) plane portions at the wafer periphery where the vertical axis is tilted from <0001> in a specific direction. This direction was <1–100>.

TEM observation of the cross-section of the interface between the sapphire substrate of the wafer and the gallium nitride layer showed nitrided polycrystals of the metal deposited by thermal decomposition of the metallo-organic material at the interface between the substrate and the gallium nitride layer. The crystals were hexagonal and 5 to 10 nm high. $\mu$-EDS analysis revealed that the Al and Ga components in the polycrystals were not uniform, and that there were regions (the composition of the regions being represented by $In_u Ga_v Al_w N_k$ where $u+v+w=1$, $0 \leq u, v, w \leq 1$, $0<k<1$) in which the stoichiometric ratio of nitrogen to metal deviated from 1:1.

The following experiment was performed to investigate the crystal growth mechanism of the Example 2.

As in Example 1, a sapphire single-crystal substrate with a (0001) plane was organically cleaned and heat-treated in the growth apparatus. The substrate was then maintained at 1180° C. in a hydrogen atmosphere not containing a nitrogen source, and supplied with TMA and TMG to form a deposition of an alloy of Al and Ga on the sapphire substrate. The TMA and TMG were then shut off and, with the temperature maintained at 1180° C., ammonia was supplied for 3 minutes at a flow rate of 0.2 mol/min to nitride the Al—Ga alloy. The apparatus was then allowed to cool to room temperature.

An atomic force microscope was used to examine the surface of the wafer thus fabricated. Nitrided polycrystals of metal particles were observed that were around 50 nm high and around 0.1 $\mu$m in diameter. The polycrystals did not cover the entire surface of the sapphire substrate: there were flat spaces between polycrystals. It is considered that the epitaxial growth of the gallium nitride layer of Example 2 proceeded with the polycrystals acting as nuclei.

Similarly, the following experiment was performed to investigate the state of the particles of group III metal deposited on the substrate surface.

As in Example 1, a sapphire single-crystal substrate with a (0001) plane was organically cleaned and heat-treated in the growth apparatus. Then, using the same conditions as in Example 2, the substrate was maintained at 1180° C. in a hydrogen atmosphere not containing a nitrogen source, and supplied with TMA and TMG to form a deposition of an alloy of Al and Ga on the sapphire substrate. The apparatus was then allowed to cool to room temperature, and an atomic force microscope was used to examine the surface. The surface was found to have particles about 100 Å high and about 500 Å long; the surface density of these particles $1 \times 10^8$ cm$^{-2}$. Some of the particles were linked together.

EXAMPLE 3

Using the same method as Example 1, a sapphire single-crystal substrate having a (0001) plane was organically cleaned and heat-treated in the growth apparatus. Following this, in a hydrogen atmosphere that did not contain a nitrogen source and at a temperature reduced to 1100° C., the substrate was supplied with TMA, TMG and trimethyl indium (TMI), another metallo-organic material, at respective flow rates of 6 μmol/min, 18 μmol/min and 18 μmol/min for 30 seconds, forming an alloy of Al, Ga and In on the sapphire substrate. The supply of the metallo-organic materials was then shut off and, with the temperature maintained at 1180° C., ammonia was supplied for 3 minutes at a flow rate of 0.2 mol/min to nitride the Al/Ga/In alloy. With the supply of ammonia maintained at the same flow rate and the apparatus temperature maintained at 1180° C., the apparatus was supplied with TMG at a flow rate of 140 μmol/min to grow a 1.1 μm layer of gallium nitride on the substrate with the Al/Ga/In alloy.

The epitaxial wafer thus fabricated had a mirror surface, and the peak width at half height of the X-ray rocking curve of the epitaxial layer of gallium nitride was 620 seconds. This indicates the excellent crystallinity of the epitaxial layer. While the above Examples 1 to 3 describe epitaxial growth of group-III nitride semiconductor crystal in the form of a layer of gallium nitride, it is also possible to grow a group-III nitride semiconductor that is a mixed crystal, represented by $In_xGa_yAl_zN$.

EXAMPLE 4

Example 4 will be used to describe a method of fabricating a gallium nitride-based compound semiconductor light-emitting device, using the method of fabricating a group-III nitride semiconductor crystal.

Figure 6:
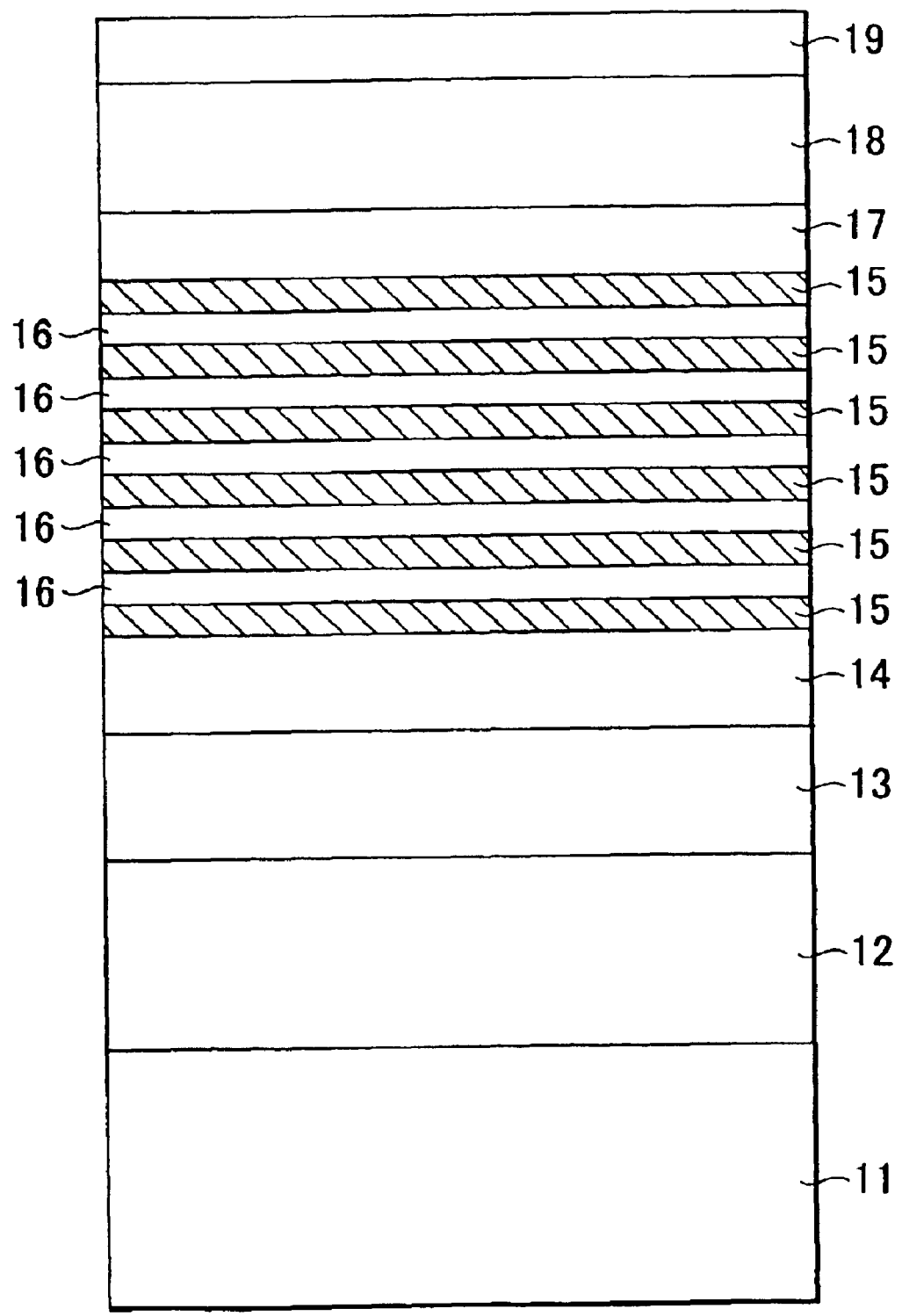
FIG. 6 shows the cross-sectional structure of a semiconductor light-emitting device fabricated in accordance with the fourth, tenth and eleventh examples of the invention.
Figure 7:
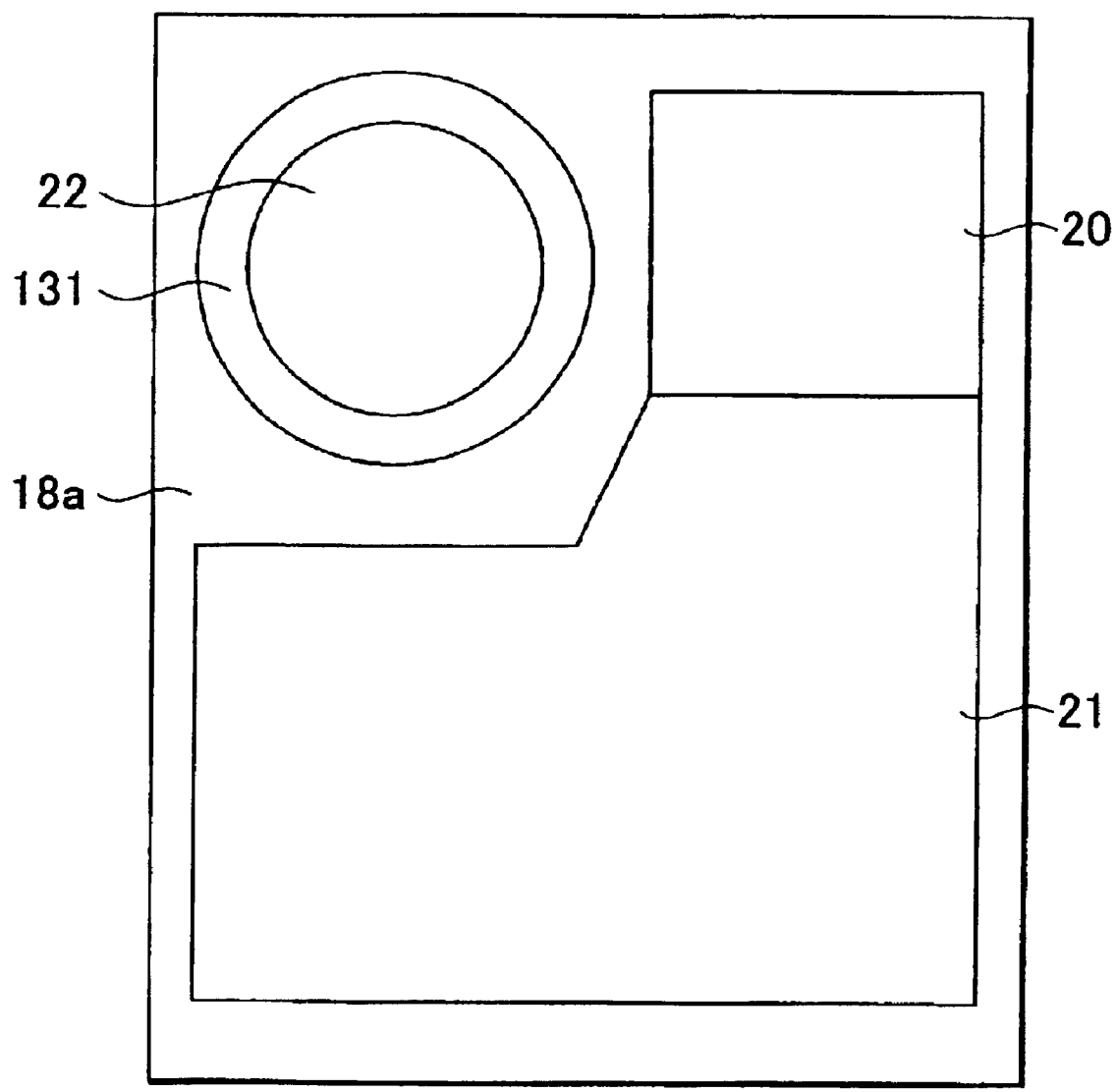
FIG. 7 is a plan view of the light-emitting device of FIG. 6.

FIG. 6 shows the epitaxial structure used for the light-emitting device fabricated in accordance with Example 4. The lattice mismatch epitaxial growth method is used to form, on a c-plane sapphire substrate 11, a 2-μm low Si doped GaN layer 12 having an electron concentration of $1\times10^{17}$ cm$^{-3}$, followed by a 1-μm highly Si doped GaN layer 13 having an electron concentration of $1\times10^{19}$ cm$^{-3}$, a 100-A $In_{0.1}Ga_{0.9}N$ cladding layer 14 having an electron concentration of $1\times10^{17}$ cm$^{-3}$, a multi quantum well structure that starts and ends with GaN barrier layers, and comprises six 70-A GaN barrier layers 15 and five 20-A non-doped $In_{0.2}Ga_{0.8}N$ well layers 16, a 30-A $Al_{0.2}Ga_{0.8}N$ diffusion prevention layer 17, an 0.15-μm Mg-doped GaN layer 18 having a hole-concentration of $8\times10^{17}$ cm$^{-3}$, and a 100-A Mg-doped $In_{0.1}Ga_{0.9}N$ layer 9 with a hole-concentration of $5\times10^{18}$ cm$^{-3}$. FIG. 7 is a plan view of the electrode structure of this light-emitting device embodiment of Example 4.

A wafer having the above epitaxial structure was fabricated by the MOCVD method, as described below.

First, the sapphire substrate was placed in a quartz reaction furnace (reactor) positioned inside the RF coil of an induction heater. A glove box supplied with nitrogen gas was used to place the substrate on a carbon susceptor, after which nitrogen gas was flowed to purge the inside of the reactor. After flowing the nitrogen gas for 10 minutes, the induction heater was activated and used to heat the substrate to 1170° C., with the temperature being elevated over a ten-minute period. At the same time, the pressure inside the reactor was adjusted to 50 hPa. Keeping the substrate temperature at 1170° C., hydrogen gas and nitrogen gas were flowed for 9 minutes to thermally clean the substrate surface. During the thermal cleaning, hydrogen carrier gas was flowed through bubblers containing trimethyl gallium (TMGa) and trimethyl aluminum (TMAl) connected to the reactor to start the bubbling. A thermobath was used to keep the bubblers at a constant temperature. Until the start of the growth process, TMGa and TMAl vapor produced by the bubbling, together with the carrier gas, was released to the outside of the system via a deharmanizing system. After completion of the thermal cleaning, the nitrogen gas valve was closed, so that only hydrogen was supplied to the reactor.

After changing the carrier gas, the substrate temperature was reduced to 1100° C. and the reactor pressure adjusted to 100 hPa. After confirming the temperature had stabilized at 1100° C., the TMGa and TMAl valves were operated to provide the reactor with a supply of gas containing TMGa and TMAl vapor, and the process of adhering metal nuclei to the sapphire substrate was initiated. A mass flow controller on the bubbling lines was used to adjust the molar ratio between the TMGa and TMAl to 2:1. After 90 seconds, the TMGa and TMAl valves were both operated to stop the delivery of gas containing TMGa and TMAl vapor. After a pause of 10 seconds, the ammonia gas valve was used to initiate delivery of ammonia gas to the reactor.

After 10 seconds, with the ammonia gas still flowing, the susceptor temperature was elevated to 1160° C. The flow rate of the TMGa was adjusted during this temperature elevation. Also, a flow of $SiH_4$ was initiated. Until the start of the formation of the low Si doped GaN layer, the $SiH_4$ continued to flow to the deharmanizing system, together with the carrier gas, for release to the outside. After confirming the susceptor temperature had reached 1160° C., the temperature was allowed to stabilize, after which the TMGa and $SiH_4$ valves were operated to initiate the supply of TMGa and $SiH_4$ to the reactor. The growth of the low Si doped GaN layer continued for about 75 minutes. Based on prior studies, the flow rate of the $SiH_4$ was controlled to achieve an electron concentration of $1\times10^{17}$ cm$^{-3}$ in the GaN layer. In this way, the low Si doped GaN layer having a thickness of 2 μm was formed.

A highly Si doped n-GaN layer was then formed on this low Si doped GaN layer. After growing the low Si doped GaN layer, the supply of TMGa and $SiH_4$ to the reactor was stopped for a one-minute period, during which time the flow rate of the $SiH_4$ was changed. Based on prior studies, the flow rate of the $SiH_4$ was controlled to achieve an electron concentration of $1\times10^{19}$ cm$^{-3}$ in the highly Si doped GaN layer. The reactor continued to be supplied with ammonia at the same flow rate. After the one minute, the supply of TMGa and $SiH_4$ was resumed and the layer was grown for 45 minutes. This resulted in the formation of a highly Si doped GaN layer having a thickness of 1 μm.

After forming the highly Si doped GaN layer, the TMGa and $SiH_4$ valves were operated to halt the supply of these materials to the reactor. The carrier gas was switched from hydrogen to nitrogen, while maintaining the flow of ammonia. The temperature of the substrate was then decreased from 1160° C. to 800° C., and at the same time the reactor pressure was changed from 100 hPa to 200 hPa. The $SiH_4$ flow rate was changed while waiting for the temperature in the reactor to change. Based on prior studies, the flow rate of the $SiH_4$ was controlled to achieve an electron concentration of $1\times10^{17}$ cm$^{-3}$ in the Si-doped InGaN cladding layer. The reactor continued to be supplied with ammonia at the same flow rate. The flow of trimethyl indium (TMIn) and triethyl gallium (TEGa) carrier gas to the bubbler had already been started. Until the start of the cladding layer formation, $SiH_4$ gas, along with the TMIn and TEGa vapor produced by the bubbling, was released to the outside of the system via a deharmanizing system, together with the carrier gas. Next, after giving the reactor time to stabilize, the supply of TMIn, TEGa and $SiH_4$ to the reactor was initiated and maintained for about 10 minutes to form a Si-doped $In_{0.1}Ga_{0.9}N$ cladding layer 100 Å thick, after which the supply of TMIn, TEGa and $SiH_4$ to the reactor was stopped.

Next to be fabricated was the multi quantum well structure comprised of GaN barrier layers and $In_{0.2}Ga_{0.8}N$ well layers. First, a GaN barrier layer was formed on the Si-doped $In_{0.1}Ga_{0.9}N$ cladding layer, then an $In_{0.2}Ga_{0.8}N$ well layer was formed on the GaN barrier layer. After repeating this five times to build up the requisite multilayer structure, the sixth GaN barrier layer was formed on the fifth $In_{0.2}Ga_{0.8}N$ well layer, creating a structure having a GaN barrier layer at each end.

More specifically, after formation of the Si-doped $In_{0.1}Ga_{0.9}N$ cladding layer was completed, there was a pause of 30 seconds, after which the supply of TEGa to the reactor was initiated while maintaining the same substrate temperature, reactor pressure, carrier gas type and carrier gas flow rate. After 7 minutes, the supply of TEGa was stopped, terminating the formation of the GaN barrier layer, constituted by a film 70 Å thick.

During the formation of the GaN barrier layers, the molar flow rate of the TMIn flowing to the deharmanizing system was doubled, compared to the flow rate during formation of the cladding layer. Following the completion of the GaN barrier layer, the supply of group III material was stopped for 30 seconds, and the TEGa and TMIn valves were then operated to supply TEGa and TMIn to the reactor, while at the same time the same substrate temperature, reactor pressure and carrier gas type and flow rate were maintained. After 2 minutes, the supply of TEGa TMIn was stopped, terminating the formation of the $In_{0.2}Ga_{0.8}N$ well layer. An $In_{0.1}Ga_{0.9}N$ cladding layer 20 Å thick was formed.

After finishing an $In_{0.2}Ga_{0.8}N$ well layer, the supply of group III material was halted for 30 seconds, after which the supply of TEGa to the reactor was initiated while maintaining the same substrate temperature, reactor pressure, carrier gas type and flow rate, to grow another GaN barrier layer. This procedure was repeated five times to fabricate the five GaN barrier layers and the five $In_{0.2}Ga_{0.8}N$ well layers. A GaN barrier layer was then formed on the final $In_{0.2}Ga_{0.8}N$ well layer.

A non-doped $Al_{0.2}Ga_{0.8}N$ diffusion prevention layer 17 was fabricated on the final GaN barrier layer. In the one minute following the stopping of the supply of TEGa to complete the GaN barrier layer, the reactor pressure was changed to 100 hPa while retaining the same substrate temperature and carrier gas type and flow rate. The flow of trimethyl aluminum (TMAl) carrier gas to the bubbler had already been started. Until the start of the step of forming the diffusion prevention layer, TMAl vapor produced by the bubbling was released to the outside of the system via a deharmanizing system, along with the carrier gas. Next, after giving the reactor pressure time to stabilize, the supply of TEGa and TMAl to the reactor was initiated. The layer was grown over the next 3 minutes or so, after which the supply of TEGa and TMAl was stopped to halt formation of the non-doped $A_{0.2}Ga_{0.8}N$ diffusion prevention layer. In this way, a 30-Å-thick non-doped $Al_{0.2}Ga_{0.8}N$ diffusion prevention layer was formed.

An Mg-doped GaN layer was then fabricated on the non-doped $Al_{0.2}Ga_{0.8}N$ diffusion prevention layer. In the 2 minutes after the supply of TEGa and TMAl was stopped to terminate the growth of the non-doped $Al_{0.2}Ga_{0.8}N$ diffusion prevention layer, the temperature of the substrate was elevated to 1060° C. and the reactor pressure changed to 200 hPa. Also, the carrier gas was changed to hydrogen. A flow of bicyclopentadienyl magnesium ($Cp_2Mg$) carrier gas through the bubbler had already started. Until the start of the step of forming the Mg-doped GaN layer, $Cp_2Mg$ vapor produced by the bubbling, along with the carrier gas, was released to the outside of the system via the deharmanizing system. After the change of temperature and pressure, the reactor pressure was given time to stabilize and the supply of TMGa and $Cp_2Mg$ to the reactor was initiated. The $Cp_2Mg$ flow rate had been studied beforehand, and was adjusted to achieve a hole-concentration of $8\times10^{17}$ $cm^{-3}$ in the Mg-doped GaN layer. After around 6 minutes of growth, the supply of TMGa and $Cp_2Mg$ was stopped to halt formation of the Mg-doped GaN layer. This process resulted in a 0.15-μm-thick Mg-doped GaN layer.

A Mg-doped InGaN layer was then formed on this Mg-doped GaN layer. After the supply of TMGa and $Cp_2Mg$ was stopped, terminating the growth of the Mg-doped GaN layer, a 2-minute period was used to lower the substrate temperature to 800° C. and the carrier gas was changed to nitrogen. The reactor was kept at the same pressure of 200 hPa. The flow rate of the $Cp_2Mg$ was modified to give the Mg-doped $In_{0.1}Ga_{0.9}N$ layer the same amount of Mg dopant as the Mg-doped GaN layer. Based on a prior study, it was judged that that amount of dopant would give the Mg-doped $In_{0.1}Ga_{0.9}N$ layer a hole-concentration of $5\times10^{18}$ $cm^{-3}$. After waiting for the substrate temperature to stabilize, the flow of TMIn, TEGa and $Cp_2Mg$ to the reactor was initiated. After a growth period of 10 minutes, the supply of TMIn, TEGa and $Cp_2Mg$ was stopped to terminate the growth of the Mg-doped $In_{0.1}Ga_{0.9}N$ layer, resulting in a Mg-doped $In_{0.1}Ga_{0.9}N$ layer 100 Å thick.

Following the completion of the Mg-doped $In_{0.1}Ga_{0.9}N$ layer, the induction heater was switched off, whereby the substrate cooled to room temperature over a 20-minute period. During this time, the atmosphere in the reactor was comprised only of nitrogen. After confirming that the substrate had cooled to room temperature, the wafer was taken out of the reactor. Thus, in accordance with the foregoing procedure, a wafer was fabricated having an epitaxial structure for use in a semiconductor light-emitting device. The Mg-doped GaN layer and the Mg-doped $In_{0.1}Ga_{0.9}N$ layer both exhibited p-type characteristics even though no annealing was used to activate p-type carriers.

Next, a wafer having the above epitaxial structure formed on a sapphire substrate was used to fabricate a light-emitting diode, which is one type of semiconductor light-emitting device or device. A known photolithography process was used to fabricate a p-side electrode on a Mg-doped $In_{0.1}Ga_{0.9}N$ layer 18a, by forming a p-electrode bonding pad 12 comprised of a lamination of layers of titanium, aluminum, and gold, in that order, and a translucent p-electrode 21 formed only of Au, adhered to the pad 12. Dry etching was then used to expose a portion 23 of a highly Si doped GaN layer to form an n-side electrode, and an n-electrode 22 of Ni and Al was fabricated at the exposed portion. FIG. 7 shows the shapes of the electrodes thus fabricated on the wafer.

The reverse side of the sapphire substrate was then ground and polished to a mirror finish, and the wafer was cut into square chips measuring 350 μm along each side. Each chip was then mounted on a lead frame with the electrode side up, and connected to the lead frame with gold wire, forming a light-emitting device. When a forward current of 20 mA was applied across the electrodes, the forward voltage was 3.0 V. The wavelength of light emitted through the p-side translucent electrode was 470 nm, and the device exhibited an output of 6 cd. Such light-emitting diode characteristics can be uniformly obtained with a light-emitting diode fabricated from virtually any part of the wafer, with no variation.

EXAMPLE 5

This is an example of a method of fabricating gallium nitride-based compound semiconductor crystal, described below.

The sequence of steps A to D shown in FIG. 1 was used to form a layer of gallium nitride-based compound semiconductor on a sapphire substrate. In step A, metal nuclei were adhered to the substrate by flowing a gas containing trimethyl aluminum (TMAl) vapor and trimethyl gallium (TMGa) vapor mixed at a molar ratio of 1:2. In step B, annealing was effected in hydrogen gas; in step C, a mixture of hydrogen and ammonia was flowed to nitride the annealed metal nuclei and form them into growth nuclei. In step D, TMGa and ammonia were flowed to effect further growth of gallium nitride on the growth nuclei, thereby fabricating on the sapphire substrate a layer of galliumnitride-based compound semiconductor provided with a film of gallium nitride crystal.

More specifically, to begin with, the sapphire substrate was placed in a quartz reactor set inside the RF coil of an induction heater. A glove-box supplied with nitrogen gas was used to place the substrate on a carbon susceptor, after which nitrogen gas was flowed for 10 minutes to purge the inside of the reactor. The induction heater was then activated and used to elevate the temperature of the substrate to 1170° C. over a ten-minute period. With the substrate temperature maintained at 1170° C., hydrogen gas and nitrogen gas were flowed for 9 minutes to thermally clean the substrate surface.

During the thermal cleaning, hydrogen carrier gas was flowed through bubblers containing trimethyl gallium (TMGa) and trimethyl aluminum (TMAl) to start the bubbling. A thermobath was used to keep the bubblers at a constant temperature. The bubbler piping was connected to the reactor. Until the start of the step of growing the layer of gallium nitride-based compound semiconductor, the TMGa vapor and TMAl vapor produced by the bubbling, along with the carrier gas, were released to the outside of the system via a deharmanizing system. After completion of the thermal cleaning, the nitrogen gas valve was closed, so that only hydrogen was supplied to the reactor. After changing the carrier gas, the substrate temperature was reduced to 1100° C. After confirming the temperature had stabilized at 1100° C., the TMGa and TMAl valves were operated to supply the reactor with gas containing TMGa and TMAl vapor to start the adhering of metal nuclei to the sapphire substrate. A mass flow controller on the bubbling lines was used to adjust the molar ratio between the TMGa and TMAl to 2:1. After 1.5 minutes of this processing, the TMGa and TMAl valves were used to stop the reactor being supplied with gas containing TMGa and TMAl vapor. This state was maintained for 3 minutes to anneal the metal nuclei in the hydrogen carrier gas. After the 3 minutes of annealing, the ammonia gas line valve was operated to initiate delivery of ammonia gas to the reactor to nitride the annealed metal nuclei to form them into growth nuclei. After flowing the gas for 10 seconds, the susceptor temperature was elevated to 1160° C. The flow rate of the TMGa was adjusted during this temperature elevation. After confirming the susceptor temperature had reached 1160° C., the temperature was allowed to stabilize, after which the TMGa valve was operated to start supplying TMGa to the reactor for further growth of gallium nitride on the growth nuclei.

After growing the gallium nitride-based compound semiconductor crystal film for 1 hour, the growth process was terminated by shutting off the supply of TMGa to the reactor. Following the ending of the formation of the gallium nitride crystal film, the induction heater was switched off and the substrate was allowed to cool to room temperature over a 20-minute period. During this time, the atmosphere in the reactor was comprised of ammonia, nitrogen and hydrogen, the same as during the growth process, but when it was confirmed that the substrate had cooled to 300° C., the ammonia and hydrogen were shut off, and nitrogen gas continued to flow until the substrate cooled to room temperature, at which point it was taken out of the reactor. By means of the above procedure, a gallium nitride crystal film 2 $\mu$m thick was formed on the sapphire substrate. The substrate removed from the reactor was colorless and transparent, and the epitaxial layer had a mirror surface.

XRC measurement of non-doped gallium nitride crystal grown by the above method was performed. Using a Cu $\beta$ line X line light source, measurement was conducted using the symmetrical (0002) plane and the asymmetrical (10–12) plane. Generally speaking, in the case of a gallium nitride-based compound semiconductor, the peak width at half height of the XRC spectrum of the (0002) plane is an index of the flatness (mosaicity), and the peak width at half height of the XRC spectrum of the (10–12) plane is an index of the dislocation density. The measurement showed the (0002) plane to have a peak width at half height value of 230 seconds, while that of the (10–12) plane was 350 seconds. Both are good values.

An atomic force microscope was used to examine the surface of the topmost film of gallium nitride crystal. The surface was found to have good morphology, with no growth pits being observed. To measure the etching-pit density of the film, a specimen was immersed for 10 minutes at 280° C. in a solution of sulfuric acid and phosphoric acid. The surface was then examined with an atomic force microscope to measure the etching-pit density, which was around $5 \times 10^7$ cm$^{-2}$.

A wafer was also fabricated using the same steps until partway through the procedure, when the specimen was removed from the reactor before the step of growing the gallium nitride crystal film. When the wafer was examined with an atomic force microscope, the sapphire surface was found to have clusters of trapezoidal cross-section crystals of gallium nitride aluminum constituting growth nuclei.

EXAMPLE 6

Figure 3:
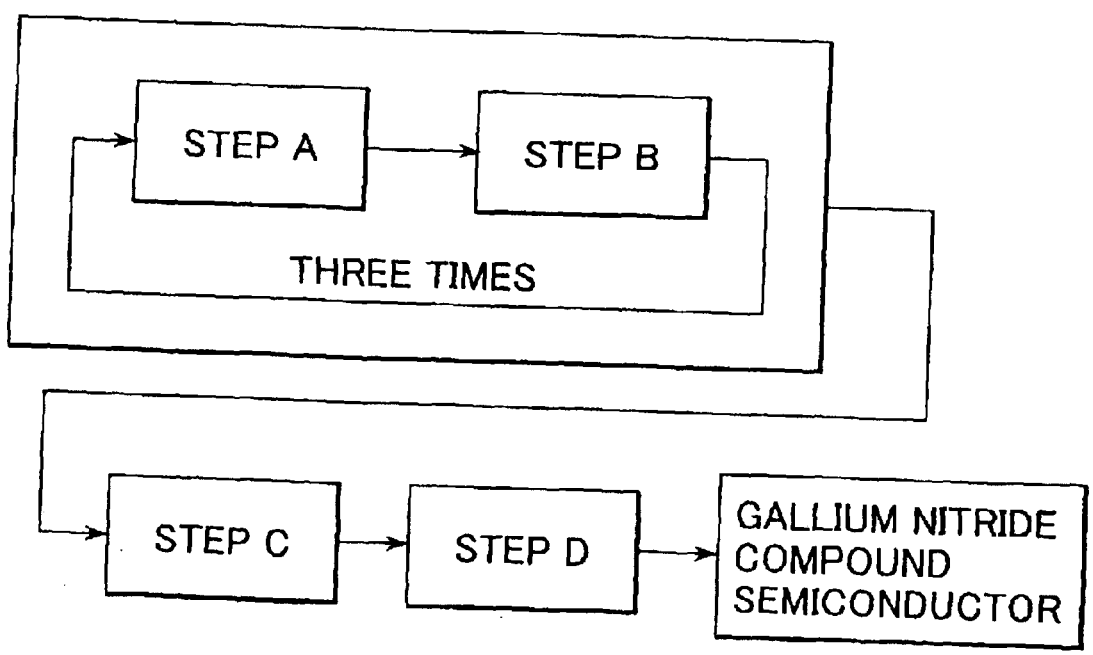
FIG. 3 shows the steps of a sixth example of the invention.

In this example, as shown in FIG. 3, a layer of gallium nitride-based compound semiconductor was formed on a sapphire substrate by repeating steps A and B three times and then proceeding with steps C and D. In step A, metal nuclei were adhered to the substrate by flowing a gas containing trimethyl aluminum (TMAl) vapor, and in step B, the metal nuclei were annealed in hydrogen gas. After repeating steps A and B three times, in step C a mixture of hydrogen and ammonia was flowed to nitride the annealed metal nuclei and form them into growth nuclei; and in step D, TMGa and ammonia were flowed to effect further growth of gallium nitride on the growth nuclei, thereby fabricating on the sapphire substrate a layer of gallium nitride-based compound semiconductor provided with a film of gallium nitride crystal.

First, the substrate surface was thermally cleaned. While this was going on, hydrogen carrier gas was flowed through bubblers containing trimethyl gallium (TMGa) and trimethyl aluminum (TMAl) to start the bubbling. The piping of each bubbler was connected to the reactor. A thermobath was used to keep the bubblers at a constant temperature. Until the start of the step of growing the layer of gallium nitride-based compound semiconductor, TMGa and TMAl vapor produced by the bubbling and the carrier gas were released to the outside of the system via a deharmanizing system. After completion of the thermal cleaning, the nitrogen gas valve was closed, so that the reactor was supplied only with hydrogen.

After changing the carrier gas, the substrate temperature was reduced to 1160° C. After confirming the temperature had stabilized at 1160° C., the TMAl valve was operated to supply the reactor with gas containing TMAl vapor to adhere the metal nuclei to the sapphire substrate.

After 3 minutes of this, the supply of TMAl-vapor-containing gas to the reactor was stopped. That state was maintained for 30 seconds to anneal the metal nuclei in the hydrogen carrier gas. After the 30 seconds of annealing, the TMAl line valve was operated to restart delivery to the reactor of gas containing TMAl vapor to adhere the metal nuclei. As in the first time, after 3 minutes of this processing, the supply of TMAl-vapor-containing gas to the reactor was stopped for 30 seconds to anneal the metal nuclei in the hydrogen carrier gas. These steps were then performed once more, repeating the formation and annealing of the metal nuclei (step A→step B) a total of three times. After the third annealing, the flow of ammonia gas to the reactor was started to nitride the annealed metal nuclei and form them into growth nuclei. After flowing the gas for 10 seconds, the TMGa valve was operated to start supplying TMGa to the reactor to effect further growth of gallium nitride on the growth nuclei.

After growing the film of gallium nitride crystal for 1 hour, the growth process was terminated by shutting off the supply of TMGa to the reactor. The induction heater was then switched off and the substrate was allowed to cool to room temperature over a 20-minute period. During this time, the atmosphere in the reactor was comprised of ammonia, nitrogen and hydrogen, the same as during the growth process, but when it was confirmed that the substrate had cooled to 300° C., the ammonia and hydrogen were shut off, while the nitrogen gas continued to be flowed until the substrate cooled to room temperature, at which point it was removed from the reactor. By means of the above procedure, a gallium nitride crystal film 2 $\mu$m thick was fabricated on the sapphire substrate. The substrate removed from the reactor was colorless and transparent, and the epitaxial layer had a mirror surface.

XRC measurement of non-doped gallium nitride crystal grown by the above method was performed. Using a Cu $\beta$ line X line light source, measurement was conducted using the symmetrical (0002) plane and the asymmetrical (10–12) plane. The measurement showed the (0002) plane to have a peak width at half height value of 300 seconds, while that of the (10–12) plane was 320 seconds. Both are good values. An atomic force microscope was used to examine the surface of the topmost film of gallium nitride crystal. The surface was found to have good morphology, with no growth pits being observed. To measure the etching-pit density of the film, a specimen was immersed for 10 minutes at 280° C. in a solution of sulfuric acid and phosphoric acid. The surface was then examined with an atomic force microscope to measure the etching-pit density, which was around $7 \times 10^7$ $cm^{-2}$.

A specimen was also fabricated using the same steps until partway through the procedure, when the wafer was removed from the reactor before the step of growing the gallium nitride crystal film. When the specimen was examined with an atomic force microscope, the sapphire surface was found to have clusters of trapezoidal cross-section crystals of gallium nitride aluminum constituting growth nuclei. Thus, in the case of this example, metal nuclei formation and annealing steps were repeated, increasing the opportunities for controlling the density the metal nuclei on the substrate and the shape of the annealed nuclei. This enables the precision of the process to be increased, and makes it possible for the gallium nitride-based compound semiconductor layer based on these metal nuclei to be given the desired shape and quality.

In Example 6, the formation and annealing of the metal nuclei were repeated three times. However, it is also possible to use just two repetitions, or to use four or more, as required.

EXAMPLE 7

Figure 4:
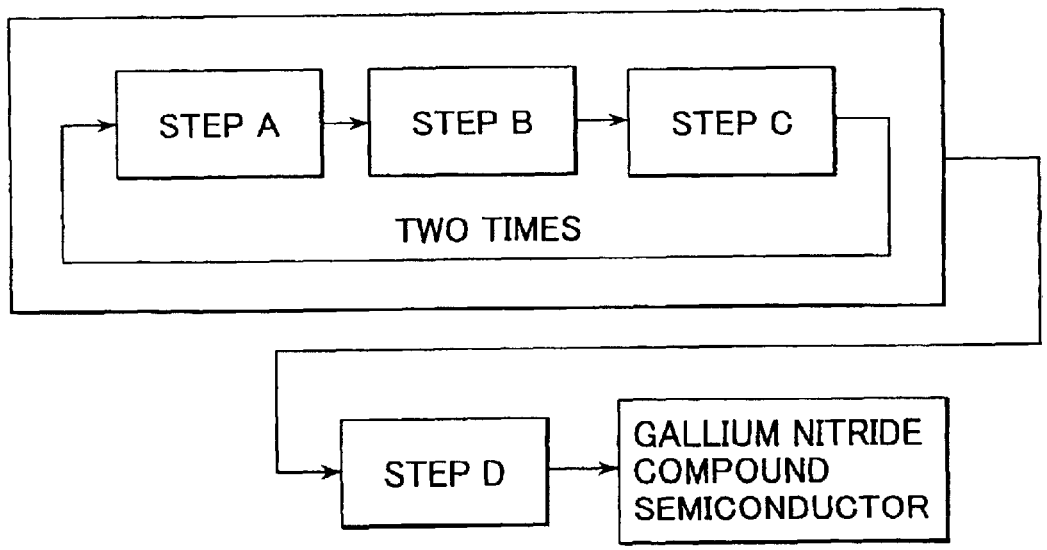
FIG. 4 shows the steps of a seventh example of the invention.

In this example, as shown in FIG. 4, a layer of gallium nitride-based compound semiconductor was formed on a sapphire substrate by repeating steps A, B and C two times and then proceeding with step D. In step A, metal nuclei were adhered to the substrate by flowing a gas containing trimethyl aluminum (TMAl) vapor, trimethyl gallium (TMGa) vapor and trimethyl indium (TMIn) vapor mixed at a molar ratio of 1:2:4, in step B the metal nuclei were annealed in hydrogen gas, and in step C a mixture of hydrogen and ammonia was flowed to nitride the annealed metal nuclei and form them into growth nuclei. After repeating steps A, B and C two times, in step D, TMGa and ammonia were flowed to effect further growth of gallium nitride on the growth nuclei, thereby fabricating on the sapphire substrate a layer of gallium nitride-based compound semiconductor provided with a film of gallium nitride crystal.

First, the substrate surface was thermally cleaned, during which time hydrogen carrier gas was flowed through bubblers containing trimethyl gallium (TMGa), trimethyl aluminum (TMAl) and trimethyl indium (TMIn) to start the bubbling. The piping of each bubbler was connected to the reactor, and a thermobath was used to keep the bubblers at a constant temperature. Until the start of the step of growing the layer of gallium nitride-based compound semiconductor, the TMGa, TMAl and TMIn vapor produced by the bubbling, and the carrier gas, were released to the outside of the system via a deharmanizing system. After completion of the thermal cleaning, the nitrogen gas valve was closed, so that the reactor was supplied only with hydrogen.

After changing the carrier gas, the substrate temperature was lowered to 900° C. After confirming the temperature had stabilized at 900° C., the TMGa, TMAl and TMIn line valves were operated to supply the reactor with gas containing TMGa, TMAl and TMIn vapor to adhere the metal nuclei to the sapphire substrate. Mass flow controllers of bubbling line were used to adjust the mixture of the TMGa, TMAl and TMIn to a molar ratio of 2:1:4.

After 3 minutes of this processing, the reactor supply of gas containing TMGa, TMAl and TMIn vapor was stopped. That state was maintained for 30 seconds to anneal the metal nuclei in the hydrogen carrier gas. After the 30 seconds of annealing, the ammonia line valve was used to supply ammonia gas to the reactor to nitride the annealed metal nuclei, forming them into growth nuclei. After flowing the ammonia gas for 1 minute, the valve was used to halt the flow of ammonia gas to the reactor. This state was maintained for 30 seconds, and then the valves were used to restart the supply of gas containing TMGa, TMAl and TMIn vapor to again effect adhering of metal nuclei to the sapphire substrate. After 3 minutes of this processing, the supply of gas containing TMGa, TMAl and TMIn vapor to the reactor was halted, and that state was maintained for 30 seconds to anneal the metal nuclei in the hydrogen carrier gas. After the 30 seconds of annealing, the ammonia line valve was used to start the supply of ammonia gas to the reactor to nitride the annealed metal nuclei, forming them into growth nuclei. This sequence of the steps of forming, annealing and nitriding the metal nuclei (step A→step B→step C) was performed two times.

After 10 seconds of gas flowing, the susceptor temperature was elevated to 1160° C. The flow rate of the TMGa was adjusted during this temperature elevation. After confirming the susceptor temperature had reached 1160° C. and allowing the temperature to stabilize, the TMGa valve was operated to start supplying TMGa to the reactor for further growth of gallium nitride on the growth nuclei. After growing the film of gallium nitride crystal for 1 hour, the growth process was terminated by shutting off the supply of TMGa to the reactor. The induction heater was then switched off and the substrate was allowed to cool to room temperature over a 20-minute period. During this time, the atmosphere in the reactor was comprised of ammonia, nitrogen and hydrogen, the same as during the growth process, but when it was confirmed that the substrate had cooled to 300° C., the ammonia and hydrogen were shut off, while the nitrogen gas continued to be flowed until the substrate cooled to room temperature, at which point it was removed from the reactor.

The above procedure was used to fabricate a non-doped gallium nitride crystal film 2 μm thick on the sapphire substrate. The substrate removed from the reactor was colorless and transparent, and the epitaxial layer had a mirror surface.

XRC measurement of non-doped gallium nitride crystal grown by the above method was performed. Using a Cu β line X line light source, measurement was conducted using the symmetrical (0002) plane and the asymmetrical (10–12) plane. The measurement showed the (0002) plane to have a peak width at half height value of 250 seconds, while that of the (10–12) plane was 300 seconds, both of which are good values. An atomic force microscope was used to examine the surface of the topmost film of gallium nitride crystal. The surface was found to have good morphology, with no growth pits being observed. To measure the etching-pit density of the film, a specimen was immersed for 10 minutes at 280° C. in a solution of sulfuric acid and phosphoric acid. The surface was then examined with an atomic force microscope to measure the etching-pit density, which was around $3 \times 10^7$ cm$^{-2}$.

A specimen was also fabricated using the same steps until partway through the procedure, when the wafer was removed from the reactor before the step of growing the gallium nitride crystal film. When the wafer was examined with an atomic force microscope, the sapphire surface was found to have clusters of trapezoidal cross-section crystals of gallium nitride aluminum constituting growth nuclei. Thus, in the case of this Example 7, the steps of metal nuclei formation, annealing and metal nuclei formation were repeated, increasing the opportunities for controlling the density of the metal nuclei on the substrate and the shape of the annealed nuclei. This enables the precision of the process to be increased, and makes it possible for the gallium nitride-based compound semiconductor layer based on these metal nuclei to be given the desired shape and quality.

In Example 7, the formation, annealing and formation of the metal nuclei were repeated two times. However, it is also possible to three or more repetitions, if required.

EXAMPLE 8

Figure 5:
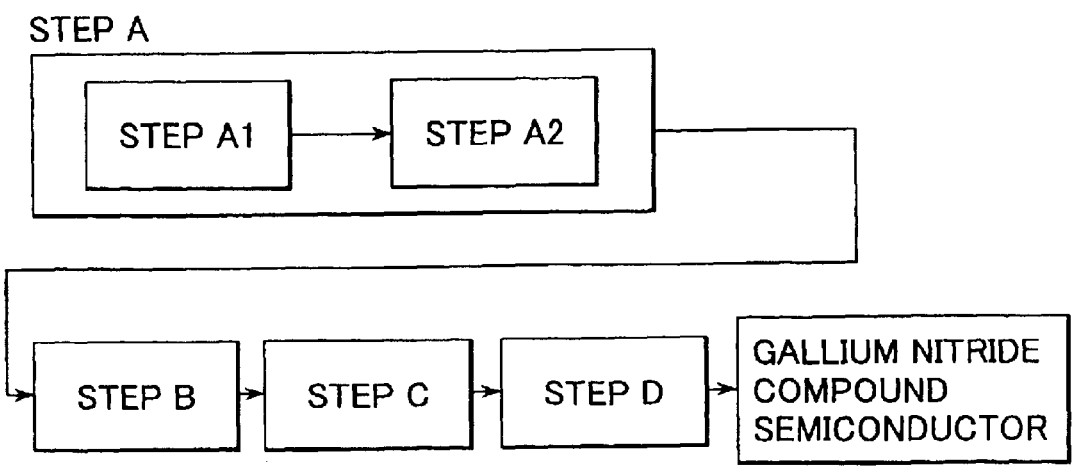
FIG. 5 shows the steps of eighth and ninth examples.

In this example of the forming of a gallium nitride-based compound semiconductor layer on a sapphire substrate, as shown in FIG. 5, step A was divided into two stages, step A1 and step A2, which were followed by steps B, C and D. In step A1, a gas containing trimethyl aluminum (TMAl) vapor was flowed, and in step A2 a gas containing trimethyl gallium (TMGa) vapor was flowed, to adhere the metal nuclei onto the substrate. Then, in step B, the metal nuclei were annealed in hydrogen gas, and in step C a mixture of hydrogen and ammonia was flowed to nitride the annealed metal nuclei to form them into growth nuclei. In step D, TMGa and ammonia were flowed to effect further growth of gallium nitride on the growth nuclei, to thereby fabricate on the sapphire substrate a layer of galliumnitride-based compound semiconductor having a film of gallium nitride crystal.

To start with, the substrate surface was thermally cleaned, during which time hydrogen carrier gas was flowed through bubblers containing trimethyl gallium (TMGa) and trimethyl aluminum (TMAl) to start the bubbling. The piping of each bubbler was connected to the reactor, and a thermobath was used to keep the bubblers at a constant temperature. Until the start of the step of growing the layer of gallium nitride-based compound semiconductor, the TMGa and TMAl vapor produced by the bubbling, along with the carrier gas, was released to the outside of the system via a deharmanizing system.

After completion of the thermal cleaning, the nitrogen gas valve was closed, so that the reactor was supplied only with hydrogen gas. After changing the carrier gas, the substrate temperature was lowered to 1100° C. After confirming the temperature had stabilized at 1100° C., the TMAl line valve was operated to supply the reactor with gas containing TMAl vapor to initiate the process of adhering metal (Al) nuclei to the sapphire substrate. After 1 minute of this processing, the valve was used to stop gas containing TMAl vapor being supplied to the reactor (step A1). Then, the TMGa valve was used to supply the reactor with gas containing TMGa vapor to initiate the process of adhering metal (Ga) nuclei to the sapphire substrate. After 2 minutes of this processing, the valve was used to stop the supply of gas containing TMGa vapor to the reactor (step A2). In this way, the forming of the metal nuclei was done in two stages, steps A1 and A2.

This state was maintained for 5 minutes, annealing the metal nuclei in the hydrogen carrier gas. After the 5 minutes of annealing, the ammonia line valve was used to initiate the supply of ammonia gas to the reactor to nitride the annealed metal nuclei, forming them into growth nuclei.

After 10 seconds of gas flowing, the susceptor temperature was elevated to 1160° C. The flow rate of the TMGa was adjusted during this temperature elevation. After confirming the susceptor temperature had reached 1160° C. and allowing the temperature to stabilize, the TMGa valve was operated to initiate a supply of TMGa to the reactor for further growth of gallium nitride on the growth nuclei.

After growing the film of gallium nitride crystal for 1 hour, the growth process was terminated by shutting off the supply of TMGa to the reactor. The induction heater was then switched off and the substrate was allowed to cool to room temperature over a 20-minute period. During this time, the atmosphere in the reactor was comprised of ammonia, nitrogen and hydrogen, the same as during the growth process, but when it was confirmed that the substrate had cooled to 300° C., the ammonia and hydrogen were shut off, while the nitrogen gas continued to be flowed until the substrate cooled to room temperature, at which point it was removed from the reactor.

Using the above procedure, a non-doped gallium nitride crystal film 2 μm thick was fabricated on the sapphire substrate. The substrate removed from the reactor was colorless and transparent, and the epitaxial layer had a mirror surface.

XRC measurement of non-doped gallium nitride crystal grown by the above method was performed. Using a Cu β line X line light source, measurement was conducted using the symmetrical (0002) plane and the asymmetrical (10–12) plane. The measurement showed the (0002) plane to have a peak width at half height value of 180 seconds, while that of the (10–12) plane was 290 seconds. When an atomic force microscope was used to examine the surface of the topmost film of gallium nitride crystal, the surface was found to have good morphology, with no growth pits being observed. To measure the etching-pit density of the film, a specimen was immersed for 10 minutes at 280° C. in a solution of sulfuric acid and phosphoric acid. The surface was then examined with an atomic force microscope to measure the etching-pit density, which was around $1 \times 10^7$ cm$^{-2}$.

A specimen was also fabricated using the same steps until partway through the procedure, when the wafer was removed from the reactor before the step of growing the gallium nitride crystal film. When the wafer was examined with an atomic force microscope, the sapphire surface was found to have clusters of trapezoidal cross-section crystals of gallium nitride aluminum constituting growth nuclei.

Thus, in the case of this Example 8, the forming of the metal nuclei was performed in two stages, which makes it possible to use a more diverse range of metals to form the nuclei and also enables the density of the metal nuclei on the substrate to be controlled more precisely. As a result, the gallium nitride-based compound semiconductor layer based on these metal nuclei can be given the desired shape and quality.

Although in Example 8 the formation of the metal nuclei was done in two stages, each effected once, each of the two stages can be repeated two or more times. Moreover, the invention is not limited to the formation step being performed in two stages. The step can instead be performed in three or more stages. Increasing the number of repetitions and the number of stages enables the metal nuclei to be formed with higher precision. In Example 8, also, although the metal nuclei are annealed in the hydrogen carrier gas after they have been formed in two stages, this annealing step can be omitted. However, in that case it becomes necessary to select an appropriate type of material for the metal nuclei, and an appropriate gas temperature and pressure for the nitriding of the nuclei.

EXAMPLE 9

As in the case of Example 8 (FIG. 5), in the forming of a gallium nitride-based compound semiconductor layer on a sapphire substrate in Example 9, step A was divided into two stages, step A1 and step A2, which were followed by steps B, C and D. In step A1, a gas containing trimethyl aluminum (TMAl) vapor was flowed, and in step A2 a gas containing trimethyl gallium (TMGa) vapor and trimethyl indium (TMIn) vapor mixed at a molar ratio of 1:2 was flowed to adhere the metal nuclei to the substrate. Steps A1 and A2 were performed at different temperatures. In step B, the metal nuclei were annealed in hydrogen gas, and in step C a mixture of hydrogen and ammonia was flowed to nitride the annealed metal nuclei to form growth nuclei. Instep D, TMGa and ammonia were flowed to effect further growth of gallium nitride on the growth nuclei, to thereby fabricate on the sapphire substrate a layer of gallium nitride-based compound semiconductor having a film of gallium nitride crystal.

First, the substrate surface was thermally cleaned, during which time hydrogen carrier gas was flowed through bubblers containing trimethyl gallium (TMGa), trimethyl aluminum (TMAl) and trimethyl indium (TMIn) to start the bubbling. The piping of each bubbler was connected to the reactor, and a thermobath was used to keep the bubblers at a constant temperature. Until the start of the step of growing the layer of gallium nitride-based compound semiconductor, the TMGa, TMAl and TMIn vapor produced by the bubbling, and the carrier gas, were released to the outside of the system via a deharmanizing system. After completion of the thermal cleaning, the nitrogen carrier gas valve was closed, so that the reactor was supplied only with hydrogen.

After changing the carrier gas, the substrate temperature was lowered to 1160° C. After confirming the temperature had stabilized at 1160° C., the TMAl line valve was operated to supply the reactor with gas containing TMAl vapor to initiate the process of adhering metal (Al) nuclei to the sapphire substrate. After 1 minute of this processing, the valve was used to stop the supply of gas containing TMAl vapor to the reactor (step A1). The susceptor temperature was then changed to 950° C. After waiting 10 seconds for the temperature to stabilize, the TMGa and TMIn valves were used to supply the reactor with gas containing TMGa and TMIn vapor to initiate the process of adhering metal (Ga and In) nuclei to the sapphire substrate. Mass flow controllers of bubbling line were used to adjust the mixture ratio of the TMGa and TMIn to a molar ratio of 1:2. After 2 minutes of this processing, the valves were used to stop the supply of gas containing TMGa and TMIn vapor to the reactor (step A2). In this way, the forming of the metal nuclei was done in two stages, steps A1 and A2.

This state was maintained for 5 minutes to anneal the metal nuclei in the hydrogen carrier gas. After the 5 minutes of annealing, the ammonia line valve was used to initiate the supply of ammonia gas to the reactor to nitride the annealed metal nuclei, forming them into growth nuclei.

After 10 seconds of gas flowing, the susceptor temperature was elevated to 1160° C. The flow rate of the TMGa was adjusted during this temperature elevation. After confirming the susceptor temperature had reached 1160° C. and allowing the temperature to stabilize, the TMGa valve was operated to initiate a supply of TMGa to the reactor to initiate further growth of gallium nitride on the growth nuclei.

After growing the film of gallium nitride crystal for 1 hour, the growth process was terminated by shutting off the supply of TMGa to the reactor. The induction heater was then switched off and the substrate was allowed to cool to room temperature over a 20-minute period. During this time, the atmosphere in the reactor was comprised of ammonia, nitrogen and hydrogen, the same as during the growth process, but when it was confirmed that the substrate had cooled to 300° C., the ammonia and hydrogen were shut off, while the nitrogen gas continued to be flowed until the substrate cooled to room temperature, at which point it was removed from the reactor.

Using the above procedure, a non-doped gallium nitride crystal film 2 μm thick was fabricated on the sapphire substrate. The substrate removed from the reactor was colorless and transparent, and the epitaxial layer had a mirror surface.

XRC measurement of non-doped gallium nitride crystal grown by the above method was performed. Using a Cu β line X line light source, measurement was conducted using the symmetrical (0002) plane and the asymmetrical (10–12) plane. The measurement showed the (0002) plane to have a peak width at half height value of 190 seconds, while that of the (10–12) plane was 260 seconds. When an atomic force microscope was used to examine the surface of the topmost film of gallium nitride crystal, the surface was found to have good morphology, with no growth pits being observed. To measure the etching-pit density of the film, a specimen was immersed for 10 minutes at 280° C. in a solution of sulfuric acid and phosphoric acid. The surface was then examined with an atomic force microscope to measure the etching-pit density, which was around $1 \times 10^7$ cm$^{-2}$.

A specimen was also fabricated using the same steps until partway through the procedure, when the wafer was removed from the reactor before the step of growing the gallium nitride crystal film. When the specimen was examined with an atomic force microscope, the sapphire surface was found to have clusters of trapezoidal cross-section crystals of gallium nitride aluminum constituting growth nuclei.

Thus, in the case of this Example 9, the forming of the metal nuclei was performed in two stages, each set at a different temperature. This makes it possible to use a more diverse range of metals to form the nuclei and, with respect to the adhering of the metal nuclei it also makes it possible to tailor the temperature more accurately to the metal used. It also enables the density of the metal nuclei on the substrate to be controlled more precisely. As a result, the gallium nitride-based compound semiconductor layer based on these metal nuclei can be given the desired shape and quality.

Although in Example 9 the formation of the metal nuclei was done in two stages, after which the nuclei were annealed in hydrogen carrier gas, the annealing step can be omitted. If that is done, the metal nuclei formation and nitriding steps can each be performed two or more times.

Comparative Example 1

A comparative wafer specimen was fabricated for comparison with specimens fabricated in accordance with each of the Examples 1 to 3 and 5 to 9. The comparative specimens were fabricated using the low-temperature buffer layer method of the prior art, as described in the above-mentioned JP-A Hei 4-297023. This method was used to fabricate a non-doped film of gallium nitride crystal 2 μm thick on the substrate. The specimen thus prepared was colorless and transparent, and the epitaxial layer had a mirror surface.

XRC measurement of the non-doped gallium nitride crystal film grown by the above prior art method showed the (0002) plane and (10–12) plane to have peak width at half height values of 400 seconds and 500 seconds, respectively. When the surface of the topmost layer of gallium nitride crystal was examined with an atomic force microscope, the surface was found to have scattered growth pits and terraces with short arches, indicating the presence of numerous dislocations. To measure the etch-pit density, specimens were prepared using the same process as Example 5. Examination with an atomic force microscope revealed an etching-pit density of $2 \times 10^9$ cm$^{-2}$.

EXAMPLE 10

In Example 10, the method described with reference to Example 8 was used to form a gallium nitride-based compound semiconductor layer on a substrate, on which other gallium nitride layers were then formed, to fabricate a semiconductor light-emitting device.

FIG. 6 shows the cross-sectional structure of the semiconductor light-emitting device fabricated in accordance with Example 10. In Example 10, the MOCVD method was used to form a multilayer structure for a semiconductor light-emitting device, using the following procedure. Metal nuclei were formed on a substrate 11 heated to a high temperature by flowing a gas containing trimethyl aluminum (TMAl) vapor, followed by the flowing of a gas containing trimethyl gallium (TMGa) vapor. The metal nuclei were then annealed in hydrogen and nitrided in ammonia. The following layers were then formed on the substrate, in the following order: a 2-μm low Si doped GaN layer 12 having an electron concentration of $1 \times 10^{17}$ cm$^{-3}$; a 1-μm highly Si doped GaN layer 13 having an electron concentration of $1 \times 10^{19}$ cm$^{-3}$; a 100-Å $In_{0.1}Ga_{0.9}N$ cladding layer 14 having an electron concentration of $1 \times 10^{17}$ cm$^{-3}$; a multi quantum well structure that started with a GaN barrier layer 15 and ended with a GaN barrier layer 15, comprising six 70-Å GaN barrier layers 15 and five 20-Å non-doped $In_{0.2}Ga_{0.8}N$ well layers 16; a 30-Å $Al_{0.2}Ga_{0.8}N$ diffusion prevention layer 17; an 0.15-μm Mg-doped GaN layer 18 having a hole-concentration of $8 \times 10^{17}$ cm$^{-3}$; and a 100-Å Mg-doped $In_{0.1}Ga_{0.9}N$ layer 19 having a hole-concentration of $5 \times 10^{18}$ cm$^{-3}$. The wafer comprised by the sapphire substrate and the above multilayer structure was then used to fabricate a light-emitting diode.

A wafer having the above epitaxial structure was fabricated by the MOCVD method, using the following steps.

First, the sapphire substrate 11 was put into a quartz reactor inside the RF coil of an induction heater. Using a glove box supplied with nitrogen gas, the substrate was placed on a carbon susceptor, after which nitrogen gas was used to purge the inside of the reactor. After flowing the nitrogen gas for 10 minutes, the induction heater was activated and used to heat the substrate to 1170° C., with the temperature being elevated over a ten-minute period. At the same time, the pressure inside the reactor was adjusted to 50 hPa. The substrate temperature was maintained at 1170° C. while hydrogen gas and nitrogen gas were flowed for 9 minutes to thermally clean the substrate surface.

During the thermal cleaning, hydrogen carrier gas was flowed through bubblers containing trimethyl gallium (TMGa) and trimethyl aluminum (TMAl) connected to the reactor, to start the bubbling. A thermobath was used to keep the bubblers at a constant temperature. Until the start of the growth process, TMGa and TMAl vapor produced by the bubbling, together with the carrier gas, was released to the outside of the system via a deharmanizing system. After completion of the thermal cleaning, the nitrogen gas valve was closed, so that only hydrogen was supplied to the reactor.

After changing the carrier gas, the substrate temperature was reduced to 1100° C. and the reactor pressure adjusted to 100 hPa. After confirming the temperature had stabilized at 1100° C., the TMAl valve was operated to provide the reactor with a supply of gas containing TMAl vapor, initiating the process of adhering metal (Al) nuclei to the sapphire substrate. After 1 minute of this process, the TMAl valve was used to stop the supply of the gas containing TMAl vapor. Next, the TMGa valve was operated to provide the reactor with a supply of gas containing TMGa vapor, again initiating the process of adhering metal (Ga) nuclei to the sapphire substrate. After 2 minutes of this process, the TMGa valve was used to stop the supply of the gas containing TMGa vapor. In this way, formation of the metal nuclei was divided into two stages.

This state was maintained for 5 minutes, annealing the metal nuclei thus formed in the hydrogen carrier gas. After the 5 minutes of annealing, the ammonia line valve was used to initiate the supply of ammonia gas to the reactor to nitride the annealed metal nuclei, forming them into growth nuclei. Up to this point, the procedure was the same as that of Example 4.

After flowing the ammonia for 10 seconds, the susceptor temperature was elevated to 1160° C. The line flow rate of the TMGa was adjusted during this temperature elevation, and a flow of $SiH_4$ was initiated. During the time until the initiation of the low Si doped GaN layer growth process, the $SiH_4$ was released to the exterior via a deharmanizing system. After confirming the susceptor temperature had reached 1160° C. and allowing the temperature to stabilize, the TMGa and $SiH_4$ valves were operated to initiate a supply of TMGa and $SiH_4$ to the reactor to start the formation of the low Si doped GaN layer, which continued for about 75 minutes. Based on prior studies, the flow rate of the $SiH_4$ was controlled to achieve an electron concentration of $1\times10^{17}$ $cm^{-3}$ in the GaN layer. In this way, a low Si doped GaN layer 12 having a thickness of 2 μm was formed.

A highly Si doped n-GaN layer was then grown on the low Si doped GaN layer. Specifically, after growing the low Si doped GaN layer 12, the supply of TMGa and $SiH_4$ to the reactor was stopped for a one-minute period, during which time the flow rate of the $SiH_4$ was changed. Based on prior studies, the flow rate of the $SiH_4$ was controlled to achieve an electron concentration of $1\times10^{19}$ $cm^{-3}$ in the highly Si doped GaN layer. The reactor continued to be supplied with ammonia at the same flow rate. After the one minute halt, the supply of TMGa and $SiH_4$ was resumed and layer formation continued for 45 minutes, resulting in a highly Si doped GaN layer 13 1 μm thick.

After forming the highly Si doped GaN layer 13, the TMGa and $SiH_4$ valves were used to halt the supply of these materials to the reactor, and the carrier gas was switched from hydrogen to nitrogen while maintaining the flow of ammonia. The temperature of the substrate was then decreased from 1160° C. to 800° C., and at the same time the reactor pressure was changed from 100 hPa to 200 hPa.

The $SiH_4$ flow rate was changed while waiting for the temperature in the reactor to change. Based on prior studies, the flow rate of the $SiH_4$ was controlled to achieve an electron concentration of $1\times10^{17}$ $cm^{-3}$ in the Si-doped InGaN cladding layer. The reactor continued to be supplied with ammonia at the same flow rate. The flow of trimethyl indium (TMIn) and triethyl gallium (TEGa) carrier gas to the bubbler had already been started. Until the start of the cladding layer formation, $SiH_4$ gas, along with the TMIn and TEGa vapor produced by the bubbling, was released to the outside of the system via a deharmanizing system, together with the carrier gas. After giving the reactor time to stabilize, the supply of TMIn, TEGa and $SiH_4$ to the reactor was initiated and maintained for about 10 minutes to form a Si-doped $In_{0.1}Ga_{0.9}N$ cladding layer 14 100 Å thick, after which the supply of TMIn, TEGa and $SiH_4$ to the reactor was stopped.

Next to be fabricated was the multi quantum well structure comprised of GaN barrier layers 15 and $In_{0.2}Ga_{0.8}N$ well layers 16. First, a GaN barrier layer 15 was formed on the Si-doped $In_{0.1}Ga_{0.9}N$ cladding layer 14, then an $In_{0.2}Ga_{0.8}N$ well layer 16 was formed on the GaN barrier layer 15. After repeating this procedure five times to build up the requisite multilayer structure, a sixth GaN barrier layer 15 was formed on a fifth $In_{0.2}Ga_{0.8}N$ well layer 16, creating a structure having a GaN barrier layer 15 at each end.

To form the first GaN layer, after the Si-doped $In_{0.1}Ga_{0.9}N$ cladding layer was completed, there was a pause of 30 seconds, after which TEGa was supplied to the reactor while maintaining the same substrate temperature, reactor pressure, carrier gas type and carrier gas flow rate. After 7 minutes the supply of TEGa was stopped, terminating the formation of the GaN barrier layer 15 at a thickness of 70 Å.

During the formation of the GaN barrier layers 15, the molar flow rate of the TMIn flowing to the deharmanizing system was doubled, compared to the flow rate used during the forming of the cladding layer 14. Following the completion of a GaN barrier layer 15, the supply of group III material was stopped for 30 seconds, and the TEGa and TMIn valves were operated to supply TEGa and TMIn to the reactor, while at the same time maintaining the same substrate temperature, reactor pressure and carrier gas type and flow rate. After 2 minutes, the supply of TEGa TMIn was stopped, completing the formation of an $In_{0.2}Ga_{0.8}N$ well layer 16 20 Å thick.

After finishing an $In_{0.2}Ga_{0.8}N$ well layer 16, the supply of group III material was halted for 30 seconds, after which the supply of TEGa to the reactor was initiated while maintaining the same substrate temperature, reactor pressure, carrier gas type and carrier gas flow rate, to grow another GaN barrier layer. This procedure was repeated five times to fabricate the five GaN barrier layers 15 and the five $In_{0.2}Ga_{0.8}N$ well layers 16. Finally, a GaN barrier layer 15 was formed on the final $In_{0.2}Ga_{0.8}N$ well layer 16.

The following procedure was used to form a non-doped $Al_{0.2}Ga_{0.8}N$ diffusion prevention layer 17 on the final GaN barrier layer 15. In the one minute following the stopping of the supply of TEGa to complete the GaN barrier layer 15, the reactor pressure was changed to 100 hPa while retaining the same substrate temperature and carrier gas type and flow rate. The flow of trimethyl aluminum (TMAl) carrier gas to the bubbler had already been started. Until the start of the step of forming the dispersion prevention layer, TMAl vapor produced by the bubbling was released to the outside of the system via a deharmanizing system, along with the carrier gas. Next, after giving the reactor pressure time to stabilize, a supply of TEGa and TMAl to the reactor was initiated. Layer formation proceeded for the next 3 minutes or so, after which the supply of TEGa and TMAl was stopped to stop the growth of the non-doped $Al_{0.2}Ga_{0.8}N$ diffusion prevention layer 17, thus obtaining a 30-Å-thick non-doped $Al_{0.2}Ga_{0.8}N$ diffusion prevention layer 17.

An Mg-doped GaN layer 18 was then grown on the non-doped $Al_{0.2}Ga_{0.8}N$ diffusion prevention layer 17. In the 2 minutes after the supply of TEGa and TMAl was stopped to complete the growth of the non-doped $Al_{0.2}Ga_{0.8}N$ diffusion prevention layer 17, the temperature of the substrate was elevated to 1060° C. and the reactor pressure changed to 200 hPa. Also, the carrier gas was changed to hydrogen.

A flow of bicyclopentadienyl magnesium (Cp$_2$Mg) carrier gas through the bubbler had already started. Until the start of the step of forming the Mg-doped GaN layer, Cp$_2$Mg vapor produced by the bubbling, along with the carrier gas, was released to the outside of the system via the deharmanizing system. After the change of temperature and pressure, the reactor pressure was given time to stabilize and the supply of TMGa and Cp$_2$Mg to the reactor was initiated. The Cp$_2$Mg flow rate had been studied beforehand, and was adjusted to achieve a hole-concentration of $8\times10^{17}$ cm$^{-3}$ in the Mg-doped GaN cladding layer. After around 6 minutes of growth, the supply of TMGa and Cp$_2$Mg was stopped to halt formation of the Mg-doped GaN layer. This process resulted in a 0.15-$\mu$m-thick Mg-doped GaN layer 18.

A Mg-doped InGaN layer 19 was then formed on this Mg-doped GaN layer 18, as follows. After the supply of TMGa and Cp$_2$Mg was stopped, terminating the growth of the Mg-doped GaN layer 18, a 2-minute period was used to lower the substrate temperature to 800° C. and to change the carrier gas to nitrogen. The reactor was kept at the same pressure of 200 hPa. The flow rate of the Cp$_2$Mg was adjusted to give the Mg-doped In$_{0.1}$Ga$_{0.9}$N layer 19 the same amount of Mg dopant as the Mg-doped GaN layer. Based on a prior study, it was judged that that amount of dopant would give the Mg-doped In$_{0.1}$Ga$_{0.9}$N layer a hole-concentration of $5\times10^{18}$ cm$^{-3}$.

After waiting for the substrate temperature to stabilize, the flow of TMIn, TEGa and Cp$_2$Mg to the reactor was initiated. After a 10-minute period of growth, the supply of TMIn, TEGa and Cp$_2$Mg was stopped to terminate the growth of the Mg-doped In$_{0.1}$Ga$_{0.9}$N layer 19. The Mg-doped In$_{0.1}$Ga$_{0.9}$N layer 19 thus formed was 100 Å thick.

Following the completion of the Mg-doped In$_{0.1}$Ga$_{0.9}$N layer 19, the induction heater was switched off and the substrate was given 20 minutes to cool to room temperature. During this time, the atmosphere in the reactor was comprised only of nitrogen. After confirming that the substrate had cooled to room temperature, the wafer thus formed was taken out of the reactor. The wafer was transparent, with a yellowish tint, and the epitaxial layer had a mirror surface. Thus, in accordance with the foregoing procedure, a wafer was fabricated having an epitaxial structure for use in a semiconductor light-emitting device. The Mg-doped GaN layer 18 and the Mg-doped In$_{0.1}$Ga$_{0.9}$N layer 19 both exhibited p-type characteristics even though no annealing was used to activate p-type carriers.

Next, a wafer having the above epitaxial structure formed on a sapphire substrate was used to fabricate a light-emitting diode. A known photolithography process was used to fabricate a p-side electrode on the surface 18a of the 100-Å Mg-doped In$_{0.1}$Ga$_{0.9}$N layer 18, by forming a p-electrode bonding pad 20 comprised of a lamination of layers of titanium, aluminum, and gold, in that order, and a transparent p-side electrode 21 formed only of gold. Dry etching was then used to expose a portion 131 of the highly Si doped GaN layer 13 for an n-side electrode, and an n-electrode 22 of Ni and Al was fabricated at the exposed portion 131. FIG. 7 shows the shapes of the electrodes thus fabricated on the wafer.

The reverse side of the sapphire substrate was then ground and polished to a mirror finish, and the wafer was cut into 350-$\mu$m-square chips. A chip was then mounted on a lead frame electrode side up, and connected to the lead frame with gold wire, to form a light-emitting device. When a forward current of 20 mA was applied across the electrodes, the forward voltage was 3.0 V. The wavelength of light emitted through the p-side translucent electrode was 470 nm, and emission output was 6 cd.

EXAMPLE 11

This example will be explained with reference to the steps used form gallium nitride-based compound semiconductor and fabricate a semiconductor light-emitting device. Metal nuclei were formed by twice alternating the flowing of TMAl (step A1) and the flowing of TMGa (step A2), and the metal nuclei were then nitrided (step C) without any annealing (step B), and a layer of gallium nitride-based compound semiconductor was then formed over the nitrided nuclei (step D). The device that was fabricated had the same structure as the one shown in FIG. 6.

An example of the device having the above structure was fabricated by the MOCVD method, as described below. A sapphire substrate 11 was placed in a quartz reactor inside the RF coil of an induction heater. A glove box supplied with nitrogen gas was used to place the substrate on a carbon susceptor for heating, after which nitrogen gas was flowed to purge the inside of the reactor. As in the case of Example 6, the substrate was thermally cleaned prior to the step of adhering the metal nuclei. During the thermal cleaning, bubbling of the same materials used in Example 6 was started, with the vapor thus produced being vented to the outside via a deharmanizing system. After completion of the thermal cleaning, the nitrogen carrier gas valve was closed, so that the reactor was supplied only with hydrogen gas.

After changing the carrier gas, the substrate temperature was reduced to 1100° C. and the reactor pressure adjusted to 100 hPa. After confirming the temperature had stabilized at 1100° C., the TMAl valve was used to start supplying the reactor with gas containing TMAl vapor to adhere aluminum nuclei to the sapphire substrate. After 2 minutes of this, the supply of TMAl to the reactor was stopped. One second later, the TMGa line valve was used to start supplying the reactor with gas containing TMGa vapor. This initiated the adhering of gallium to the aluminum nuclei on the substrate. After 4 minutes, the supply of TMGa to the reactor was stopped. This operation of supplying TMAl and TMGa to the reactor was repeated twice.

Simultaneously with the stopping of the second time supply of TMGa vapor to the reactor, the ammonia gas line valve was used to start supplying the reactor with ammonia gas, initiating nitriding of the metal nuclei. After 10 seconds, the susceptor temperature was elevated to 1160° C. while maintaining the flow of ammonia gas. Next came the fabrication of the low Si doped GaN layer. The same procedure described with reference to Example 10 was used to grow a low Si doped GaN layer 12, a highly Si doped GaN layer 13, an In$_{0.1}$Ga$_{0.9}$N cladding layer 14, a multi quantum well structure comprised of six GaN barrier layers 15 alternated with five non-doped In$_{0.2}$Ga$_{0.8}$N well layers 16, an Al$_{0.2}$Ga$_{0.8}$N diffusion prevention layer 17, a Mg-doped GaN layer 18 and a Mg-doped In$_{0.1}$Ga$_{0.9}$N layer 19.

After completion of the Mg-doped In$_{0.1}$Ga$_{0.9}$N layer forming the topmost layer of the wafer, the induction heater was switched off and the substrate was allowed to cool to room temperature over a 20-minute period, during which time the only gas in the reactor was nitrogen. After confirming that the substrate had cooled to room temperature, the wafer was taken out of the reactor. The wafer was transparent, with a yellowish tint, and the epitaxial layer had a mirror surface.

Thus, in accordance with the foregoing procedure, a wafer was fabricated having a multilayer structure for semiconductor light-emitting device applications. The procedure used for Example 6 was used to form electrodes on the wafer, cut the wafer into chips and mount the chips on lead frames to form light-emitting devices. When a forward current of 20 mA was applied across the electrodes of a light-emitting diode thus fabricated, the forward voltage was 3.2 V. The wavelength of light emitted through the p-side electrode was 470 nm, and the device exhibited an output of 5 cd.

EXAMPLE 12

In this example, the method of the invention was used to form a gallium nitride-based compound semiconductor layer on a substrate, and to form other gallium nitride-based compound semiconductor layers on the first layer, to form a laminated structure constituting a semiconductor light-emitting device.

Figure 8:
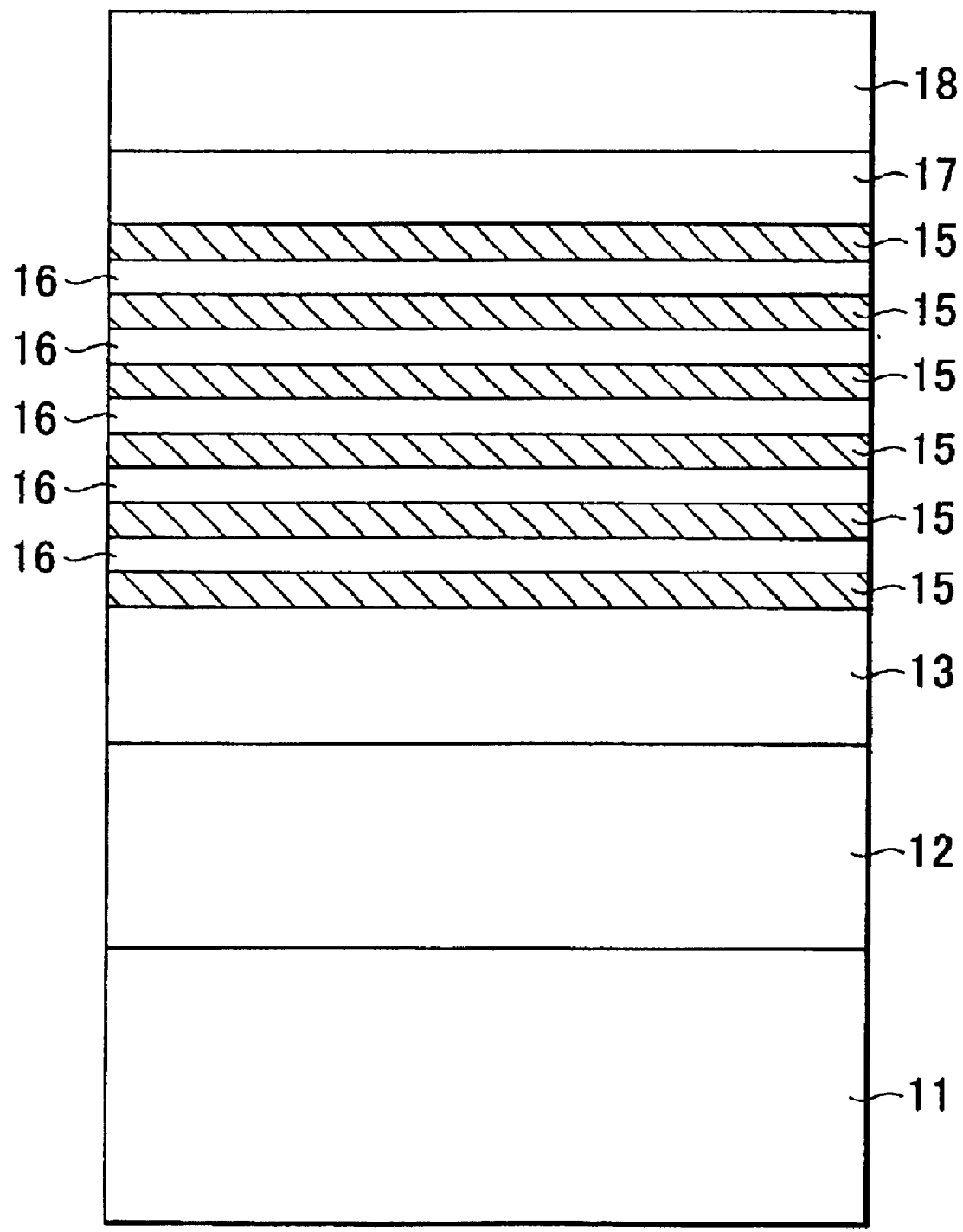
FIG. 8 shows the cross-sectional structure of a semiconductor light-emitting device fabricated in accordance with the twelfth and fifteenth examples of the invention.

FIG. 8 shows the cross-sectional structure of a semiconductor light-emitting device fabricated in accordance with Example 12. The MOCVD method was used to form a wafer having this multilayer structure for a semiconductor light-emitting device, as follows. Metal nuclei were formed on a sapphire substrate 11 heated to a high temperature by flowing a gas containing trimethyl aluminum (TMAl) vapor, followed by the flowing of a gas containing trimethyl gallium (TMGa) vapor. The metal nuclei were then annealed in hydrogen and nitrided in ammonia. The following layers were then formed on the substrate, in the following order: a 2-$\mu$m low Si doped GaN layer 12 having an electron concentration of $1\times10^{17}$ cm$^{-3}$; a 1-$\mu$m highly Si doped GaN layer 13 having an electron concentration of $1\times10^{19}$ cm$^{-3}$; a multi quantum well structure that started with a GaN barrier layer 15 and ended with a GaN barrier layer 15, comprising six 70-A GaN barrier layers 15 and five 20-A non-doped In$_{0.2}$Ga$_{0.8}$N well layers 16; a 30-A Al$_{0.2}$Ga$_{0.8}$N diffusion prevention layer 17; and an 0.15-$\mu$m Mg-doped GaN layer 18 having a hole-concentration of $8\times10^{17}$ cm$^{-3}$. The wafer comprising the sapphire substrate and the above multilayer structure was used to fabricate a light-emitting diode.

A wafer having the above multilayer epitaxial structure was fabricated by the MOCVD method, using the following procedure.

First, the sapphire substrate 11 was put into a quartz reactor inside the RF coil of an induction heater. A glove box supplied with nitrogen gas was used to position the substrate on a carbon susceptor for heating, after which nitrogen gas was used to purge the inside of the reactor. After flowing the nitrogen gas for 10 minutes, the induction heater was activated and used to heat the substrate to 1170° C., with the temperature being elevated over a ten-minute period. At the same time, the pressure inside the reactor was adjusted to 50 hPa. The substrate temperature was maintained at 1170° C. while hydrogen gas and nitrogen gas were flowed for 9 minutes to thermally clean the substrate surface.

During the thermal cleaning, hydrogen carrier gas was flowed through bubblers containing trimethyl gallium (TMGa) and trimethyl aluminum (TMAl) connected to the reactor, to start the bubbling. A thermobath was used to keep the bubblers at a constant temperature. Until the start of the growth process, TMGa and TMAl vapor produced by the bubbling, together with the carrier gas, was released to the outside of the system via a deharmanizing system. After completion of the thermal cleaning, the nitrogen gas valve was closed, so that only hydrogen was supplied to the reactor.

After changing the carrier gas, the substrate temperature was reduced to 1160° C. and the reactor pressure adjusted to 100 hPa. After confirming the temperature had stabilized at 1160° C., the TMAl valve was operated to provide the reactor with a supply of gas containing TMAl vapor, initiating the process of adhering metal (Al) nuclei to the sapphire substrate 11. After 3 minutes of this process, the TMAl valve was used to stop the supply of the gas containing TMAl vapor. Next, the TMGa valve was operated to provide the reactor with a supply of gas containing TMGa vapor, again initiating the process of adhering metal (Ga) nuclei to the sapphire substrate 11. After 3 minutes of this process, the TMGa valve was used to stop the supply of gas containing TMGa vapor. In this way, formation of the metal nuclei was divided into two stages.

This state was maintained for 5 minutes, annealing the metal nuclei thus formed in the hydrogen carrier gas. After the 5-minute annealing, the ammonia line valve was used to initiate the supply of ammonia gas to the reactor to nitride the annealed metal nuclei, forming them into growth nuclei. The TMGa line mass flow controller was used to adjust the flow, while the flow of ammonia continued, and a flow of SiH$_4$ was initiated. During the time until the initiation of the low Si doped GaN layer growth process, the SiH$_4$ was released to the exterior via a deharmanizing system, together with the carrier gas. The TMGa and SiH$_4$ flow rates were allowed to stabilize, after which the TMGa and SiH$_4$ valves were used to start supplying the reactor with TMGa and SiH$_4$, initiating the growth of the low Si doped GaN layer, which continued for about 75 minutes. Based on prior studies, the flow rate of the SiH$_4$ was controlled to achieve an electron concentration of $1\times10^{17}$ cm$^{-3}$ in the GaN layer. In this way, a low Si doped GaN layer 12 2 $\mu$m thick was formed.

Next, a highly Si doped n-GaN layer was grown on the low Si doped GaN layer 12. Specifically, after growing the low Si doped GaN layer 12, the supply of TMGa and SiH$_4$ to the reactor was stopped for one minute, during which time the flow rate of the SiH$_4$ was changed. Based on prior studies, the flow rate of the SiH$_4$ was controlled to provide the highly Si doped GaN layer with an electron concentration of $1\times10^{19}$ cm$^{-3}$. The reactor continued to be supplied with ammonia at the same flow rate. After the one minute halt, the supply of TMGa and SiH$_4$ was resumed and layer formation continued for 45 minutes, resulting in a highly Si doped GaN layer 13 1 $\mu$m thick.

After forming the highly Si doped GaN layer 13, the TMGa and SiH$_4$ valves were used to halt the supply of these materials to the reactor, and the carrier gas was switched from hydrogen to nitrogen while maintaining the flow of ammonia. The temperature of the substrate was then decreased from 1160° C. to 800° C., and at the same time the reactor pressure was changed from 100 hPa to 200 hPa. While waiting for the reactor temperature to change, ammonia continued to be supplied to the reactor at the same flow rate. The flow of trimethyl indium (TMIn) and triethyl gallium (TEGa) carrier gas to the bubbler had already been started. Until the start of active layer formation, the TMIn and TEGa vapor produced by the bubbling was released to the outside of the system via a deharmanizing system, with the carrier gas.

Next to be fabricated was the multi quantum well structure comprised of the GaN barrier layers 15 and the In$_{0.2}$Ga$_{0.8}$N well layers 16. Fabrication comprised first forming a GaN barrier layer 15 on the Si-doped GaN contact layer 13, then forming an In$_{0.2}$Ga$_{0.8}$N well layer 16 on the GaN barrier layer 15. This structure was repeated five times, and the sixth GaN barrier layer 15 was then formed on the fifth In$_{0.2}$Ga$_{0.8}$N well layer 16, creating a structure having a GaN barrier layer 15 at each end.

To form the first GaN layer, the TEGa valve was used to supply TEGa to the reactor while maintaining the same substrate temperature, reactor pressure, carrier gas type and carrier gas flow rate. After 7 minutes the supply of TEGa was stopped, terminating the formation of the GaN barrier layer 15 at a thickness of 70 Å.

Following the completion of the GaN barrier layer 15, the supply of group III material was stopped for 30 seconds, and the TEGa and TMIn valves were operated to supply TEGa and TMIn to the reactor, while at the same time maintaining the same substrate temperature, reactor pressure and carrier gas type and flow rate. After 2 minutes, the supply of TEGa TMIn was stopped, completing the formation of an $In_{0.2}Ga_{0.8}N$ well layer 16 20 Å thick. After finishing the $In_{0.2}Ga_{0.8}N$ well layer 16, the supply of group III material was halted for 30 seconds, after which the supply of TEGa to the reactor was initiated while maintaining the same substrate temperature, reactor pressure, carrier gas type and carrier gas flow rate, to grow another GaN barrier layer 15. This procedure was repeated five times to fabricate the five GaN barrier layers 15 and the five $In_{0.2}Ga_{0.8}N$ well layers 16. Finally, a GaN barrier layer 15 was formed on the final $In_{0.2}Ga_{0.8}N$ well layer 16.

The following procedure was used to form a non-doped $Al_{0.2}Ga_{0.8}N$ diffusion prevention layer 17 on the final GaN barrier layer 15 of the quantum well structure. In the one minute following the stopping of the supply of TEGa to complete the GaN barrier layer 15, the reactor pressure was changed to 100 hPa while retaining the same substrate temperature and carrier gas type and flow rate. The flow of trimethyl aluminum (TMAl) carrier gas to the bubbler had already been started. Until the start of the step of forming the dispersion prevention layer, TMAl vapor produced by the bubbling was released to the outside of the system via a deharmanizing system, with the carrier gas. After giving the reactor pressure time to stabilize, the TEGa and TMAl valves were operated to start the delivery of TEGa and TMAl to the reactor. Layer formation was effected for the next 3 minutes or so, after which the supply of TEGa and TMAl was stopped to stop the formation of the non-doped $Al_{0.2}Ga_{0.8}N$ diffusion prevention layer 17. The non-doped $Al_{0.2}Ga_{0.8}N$ diffusion prevention layer 17 thus obtaining was 30 Å thick.

The following procedure was then used to grow a Mg-doped GaN layer 18 on the non-doped $Al_{0.2}Ga_{0.8}N$ diffusion prevention layer 17. In the 2 minutes after the supply of TEGa and TMAl was stopped to finish the growth of the non-doped $Al_{0.2}Ga_{0.8}N$ diffusion prevention layer 17, the temperature of the substrate was elevated to 1060° C., the reactor pressure changed to 200 hPa, and the carrier gas was changed, to hydrogen. A flow of bicyclopentadienyl magnesium ($Cp_2Mg$) carrier gas through the bubbler had already started. Until the start of the step of forming the Mg-doped GaN layer, $Cp_2Mg$ vapor produced by the bubbling, was released to the outside of the system via the deharmanizing system, with the carrier gas.

After the change of temperature and pressure, the reactor pressure was given time to stabilize and the supply of TMGa and $Cp_2Mg$ to the reactor was initiated. The $Cp_2Mg$ flow rate had been studied beforehand, and was adjusted to achieve a hole-concentration of $8 \times 10^{17}$ $cm^{-3}$ in the Mg-doped GaN cladding layer. After around 6 minutes of layer growth, the supply of TMGa and $Cp_2Mg$ was stopped to halt formation of the Mg-doped GaN layer. This process resulted in a 0.15-μm-thick Mg-doped GaN layer 18.

A Mg-doped InGaN layer 19 was then fabricated on the Mg-doped GaN layer 18, as follows. After the supply of TMGa and $Cp_2Mg$ was stopped, terminating the growth of the Mg-doped GaN layer 18, a 2-minute period was used to lower the substrate temperature to 800° C. and to change the carrier gas to nitrogen. The reactor was kept at the same pressure of 200 hPa. The induction heater was then switched off and the substrate given 20 minutes to cool to room temperature. During this cooling period, the atmosphere in the reactor was comprised of a 1% mixture of ammonia in nitrogen. After confirming that the substrate had cooled to room temperature, the wafer thus formed was removed from the reactor. The wafer was transparent, with a yellowish tint, and the epitaxial layer had a mirror surface. Thus, in accordance with the foregoing procedure, a wafer was fabricated having an epitaxial structure for use in a semiconductor light-emitting device. The Mg-doped GaN layer 18 exhibited p-type characteristics even though no annealing was used to activate p-type carriers.

A wafer having the above epitaxial structure formed on a sapphire substrate 11 was used to fabricate a light-emitting diode. A known photolithography process was used to fabricate a p-side electrode on the surface 18a of the 100-Å Mg-doped $In_{0.1}Ga_{0.9}N$ layer 18, by forming a p-electrode bonding pad 20 comprised of a lamination of layers of titanium, aluminum, and gold, in that order, and a transparent p-side electrode 21 formed only of gold. Dry etching was then used to expose a portion 131 of the highly Si doped GaN layer 13 for an n-side electrode, and an n-electrode 22 of Ni and Al was fabricated at the exposed portion 131. FIG. 7 shows the shapes of the electrodes thus fabricated on the wafer.

The reverse side of the sapphire substrate was then ground and polished to a mirror finish and the wafer cut into 350-μm-square chips. A chip was then mounted on a lead frame electrode side up and connected to the lead frame with gold wire, to form a light-emitting device. When a forward current of 20 mA was applied across the electrodes, the forward voltage was 3.0 V. The wavelength of light emitted through the p-side translucent electrode was 472 nm, and emission output was 5.9 cd.

Comparative Example 2

In Comparative Example 2, a wafer was fabricated using the low-temperature buffer layer method of the prior art. This method was used to fabricate a non-doped film of gallium nitride crystal 2 μm thick on a substrate. The wafer thus prepared was colorless and transparent, and the epitaxial layer had a mirror surface. In the same way as in Example 10, p- and n-side electrodes were formed on the wafer, and the reverse side of the sapphire substrate was ground and polished to a mirror finish, and the wafer was cut into 350-μm-square chips. A chip was then mounted on a lead frame electrode side up, and connected to the lead frame with gold wire, forming a light-emitting device. When a forward current of 20 mA was applied across the electrodes, the forward voltage was 4.0 V. The wavelength of light emitted through the p-side translucent electrode was 470 nm, and emission output was 3 cd.

The good quality of the gallium nitride-based compound semiconductor layer formed on the substrate in accordance with the method of this invention improves the emission layer crystallinity, enhancing the emission quantum yield.

EXAMPLE 13

An example will now be described in which gallium nitride-based compound semiconductor crystal is grown using a slow-growth mask layer formed on the substrate. In this example, the crystal was grown on the substrate in accordance with the steps shown in FIG. 9. The MOCVD method was used to fabricate an epitaxial specimen by flowing ammonia and disilane ($Si_2H_6$), then flowing a mixture of TMG and TMA, then flowing ammonia to form on a substrate heated to a high temperature, a mask layer having a region covered by silicon nitride and a region where aluminum nitride and gallium nitride were adhered to the sapphire substrate, and forming a non-doped GaN layer on that layer.

The MOCVD method was used to fabricate a specimen that included the above GaN layer, as follows.

A sapphire substrate 11 was placed in a quartz reactor inside the RF coil of an induction heater, where the substrate was mounted on a carbon susceptor for heating. The air was then evacuated from the reactor, through which nitrogen gas was then flowed to purge the interior of the reactor. After the nitrogen gas had been flowing for 10 minutes, the heater was activated and used to heat the substrate to 1170° C. over a 10-minute period. The substrate was maintained at 1170° C. for 9 minutes while flowing hydrogen and nitrogen gas, to thermally clean the substrate surface.

During the thermal cleaning, hydrogen carrier gas was flowed through a bubbler, connected to the reactor, containing trimethyl gallium (TMG), to start the bubbling. A thermobath was used to keep the bubbler at a constant temperature. Until the start of the GaN layer growth process, the TMG vapor produced by the bubbling was released to the outside of the system via a deharmanizing system, along with the carrier gas.

After completion of the thermal cleaning, the ammonia and disilane gas valves were used to effect flowing of ammonia and disilane gas over the sapphire substrate for 1 minute, when the valves were used to stop the supply of the ammonia and disilane gas. Next, the nitrogen carrier gas valve was used to start supplying the reactor with nitrogen gas. After 1 minute, the TMA and TMG valves were turned on to supply the reactor with carrier gas containing TMG and TMA vapor for 1 minute, after which the supply of TMA and TMG was shut off and the carrier gas valve was used to start nitrogen flowing to the reactor. After 1 minute, the supply of ammonia to the reactor was started, and continued for 10 minutes, when it was turned off and the nitrogen supply turned on. The mask layer formed by these steps comprised silicon nitride regions 5 and gallium nitride aluminum regions 8.

After forming the mask layer, the substrate temperature was reduced to 1160° C. After confirming the temperature had stabilized at 1160° C., the ammonia gas line valve was operated to start supplying the reactor with ammonia gas 4. After 1 minute, the TMG line valve was operated to provide the reactor with gas containing TMG vapor to grow a GaN layer 9 on the mask layer. After the growth of the GaN layer had proceeded for some 2 hours, the TMG supply was shut off to terminate the growth. The heater was then switched off and the specimen removed, using the procedure used in Example 1. Thus, in accordance with the foregoing procedure, a mask layer was formed on a sapphire substrate 1 and a 2-$\mu$m-thick GaN layer was formed on the mask layer to fabricate a specimen. The substrate removed from the reactor was colorless and transparent; the epitaxial layer had a mirror surface.

XRC measurement of the non-doped GaN layer grown by the above method was performed. Using a Cu $\beta$ line X line light source, measurement was conducted using the symmetrical (0002) plane and the asymmetrical (10–12) plane. Generally speaking, in the case of a gallium nitride-based compound semiconductor, the peak width at half height of the XRC spectrum of the (0002) plane is an index of the crystal's flatness, and the peak width at half height of the XRC spectrum of the (10–12) plane is an index of the dislocation density. The measurement showed the (0002) plane to have a peak width at half height value of 280 seconds, while that of the (10–12) plane was 300 seconds.

Examination of the topmost surface layer of the GaN with an atomic force microscope showed a good surface morphology, with no growth pits. To measure the etching-pit density of the film, a specimen was immersed for 10 minutes at 280° C. in a solution of sulfuric acid and phosphoric acid. The surface was then examined with an atomic force microscope to measure the etching-pit density, which was found to be around $9 \times 10^6$ cm$^{-2}$.

EXAMPLE 14

In this example, the crystal was grown on the substrate by the steps shown in FIG. 10, using the MOCVD method. The surface of a sapphire substrate was nitrided by flowing ammonia gas at a high temperature. A mask layer was formed on the substrate by flowing a mixture of silane and TMG and then flowing ammonia, to form a mask layer comprising a region covered by silicon nitride and a region where gallium nitride adhered to the substrate. A non-doped GaN layer was then formed on the mask layer.

The MOCVD method was used to fabricate a specimen that included the above GaN layer, as follows, using the same MOCVD apparatus as Example 13. Thus, a sapphire substrate was thermally cleaned in the same way as in Example 13, during which bubbling was started. After completion of the thermal cleaning, the ammonia was flowed over the substrate for 20 minutes and then stopped. Next, the nitrogen carrier gas valve was operated to start supplying the reactor with nitrogen gas. Then, the silane and TMG valves were turned on to supply the reactor with carrier gas containing silane and TMG vapor for 30 seconds, after which the TMG and silane were shut off and the carrier gas valve was used to start the delivery of nitrogen to the reactor. After 1 minute, a flow of ammonia to the reactor was started and continued for 10 minutes, after which it was turned off and the nitrogen supply turned on. This process formed a mask layer on the sapphire substrate comprising silicon nitride regions 5 and gallium nitride regions 8.

After forming the mask layer, the substrate temperature was reduced to 1180° C. After confirming the temperature had stabilized at 1180° C., the ammonia supply was turned on to flow ammonia to the reactor. After 1 minute of this, the TMG line valve was opened to supply the reactor with gas containing TMG vapor to form a GaN layer on the mask layer. After some 2 hours of growing the GaN layer, the TMG supply was shut off to stop the growth process. The heater was then switched off and the specimen removed from the reactor, using the procedure described in Example 1. Thus, in accordance with the foregoing procedure, a mask layer (5, 8) was formed on the sapphire substrate 1 and forming a 2-$\mu$m-thick GaN layer was formed on the mask to fabricate a specimen. The substrate removed from the reactor was colorless and transparent, with a mirror-surface epitaxial layer.

XRC measurement of the non-doped GaN layer grown by the above method was performed. The (0002) plane had a peak width at half height value of 290 seconds, while that of the (10–12) plane was 420 seconds. Examination of the surface of the topmost layer of the GaN with an atomic force microscope showed a good surface morphology, with no growth pits. To measure the etching-pit density of the film, a specimen was prepared in the same way as in Example 13, and an atomic force microscope was used to measure the etching-pit density, which was found to be around $6 \times 10^7$ cm$^{-2}$.

EXAMPLE 15

This example is used to describe a method of fabricating a light-emitting device using gallium nitride-based compound semiconductor that includes a step of fabricating the gallium nitride-based compound semiconductor by the method described in Example 13. The cross-sectional structure of the light-emitting device thus fabricated had the same structure as Example 12, shown in FIG. 8. The MOCVD method was used to form a wafer having this multilayer structure for a semiconductor light-emitting device, by flowing ammonia and disilane (Si$_2$H$_6$), then a mixture of TMG and TMA, then ammonia to form, on a sapphire substrate heated to a high temperature, a mask layer having a region covered by silicon nitride and a region covered with GaAlN. The following layers were then formed thereon, in the following order: a 2-$\mu$m low Si doped GaN layer 12 having an electron concentration of $1 \times 10^{17}$ cm$^{-3}$; a 1-$\mu$m highly Si doped GaN layer 13 having an electron concentration of $1 \times 10^{19}$ cm$^{-3}$; a multi quantum well structure that started with a GaN barrier layer 15 and ended with a GaN barrier layer 15, comprising six 70-Å GaN barrier layers 15 and five 20-Å non-doped In$_{0.2}$Ga$_{0.8}$N well layers 16; a 30-Å Al$_{0.2}$Ga$_{0.8}$N diffusion prevention layer 17; and an 0.15-$\mu$m Mg-doped GaN layer 18 having a hole-concentration of $8 \times 10^{17}$ cm$^{-3}$.

Using the MOCVD method and the same procedure as Example 13, the first layer to be formed was the 2-$\mu$m-thick, flat-surface, low Si doped GaN layer 12 having an electron concentration of $1 \times 10^{17}$ cm$^{-3}$. Then, using the same procedure described in Example 12, the highly Si doped GaN layer 13 was formed on the GaN layer 12, followed by the multi quantum well structure, the Al$_{0.2}$Ga$_{0.8}$N diffusion prevention layer 17, and the Mg-doped GaN layer 18.

On the wafer removed from the reactor, a known photolithography process was used to fabricate a bonding pad comprised of layers of titanium, aluminum, and gold, laminated in that order starting from the surface of the p-type InGaN layer, and a transparent p-side electrode formed of gold and nickel oxide layers, arranged in that order. Dry etching was then used to expose a portion of the n-type GaN layer for the n-side electrode, and an n-side electrode of aluminum was fabricated on the exposed portion. The reverse side of the sapphire substrate was then ground and polished to a mirror finish and the wafer cut into 350-$\mu$m-square chips. A chip was then mounted on a lead frame electrode side up and connected to the lead frame with gold wire, to form a light-emitting device. When a forward current of 20 mA was applied across the electrodes, the forward voltage was 3.0 V. The wavelength of light emitted through the p-side translucent electrode was 465 nm, and emission output was 3 cd.

Industrial Applicability

As described in the foregoing, the method of fabricating group-III nitride semiconductor crystal, according to this invention, readily enables the fabrication of high-quality group-III nitride semiconductor crystal without the rigorous control of fabrication conditions that is required by the prior art method using a low-temperature buffer layer. As a result, when the group-III nitride semiconductor crystal formed by the method of this invention is used to fabricate light-emitting devices, substantially uniform high-brightness device characteristics can be obtained with devices fabricated from virtually any part of the wafer.

Moreover, in accordance with the method of fabricating gallium nitride-based compound semiconductor of this invention, the gallium nitride-based compound semiconductor is fabricated by adhering metal nuclei to the substrate to use as growth nuclei. In addition, a gallium nitride-based compound semiconductor layer is also grown on the growth nuclei. The density of the metal nuclei on the substrate can be controlled by controlling the metallo-organic gas flow rates, the timing of gas utilization, process temperatures, and other conditions.

Annealing and nitriding of the metal nuclei enable them to be applied to vertical and horizontal epitaxial growth, and also makes it possible to obtain growth nuclei of a desired shape, such as trapezoidal, for example. More gallium nitride-based compound semiconductor is grown on the growth nuclei, filling the spaces between adjacent growth nuclei and making it possible to grow flat layers thereon. It is therefore possible to form layers of gallium nitride-based compound semiconductor having a desired thickness and good crystallinity. Since a gallium nitride-based compound semiconductor is overlaid on the surface of the gallium nitride-based compound semiconductor layer, very good lattice matching characteristics can be maintained. Thus, it is possible to form on the substrate layers of gallium nitride-based compound semiconductor, each having good crystallinity. This improves the emission characteristics of a semiconductor light-emitting device fabricated using the gallium nitride-based compound semiconductor. A semiconductor light-emitting device fabricated by the above method can also be used in electronic equipment, vehicles, traffic signals and the like as a light source having good brightness and other such emission characteristics. And, compared to semiconductor light-emitting devices fabricated by prior art methods, light-emitting devices fabricated by the method of this invention are more efficient and deteriorate at a slower rate, so they use less energy, reduce costs, and do not have to be replaced as frequently.

What is claimed is:

1. A method of fabricating a group-III nitride semiconductor crystal comprising: a first step of depositing particles of a group III metal on a substrate surface; a second step of nitriding the particles in an atmosphere containing a nitrogen source; and a third step of using a vapor phase growth method to grow a group-III nitride semiconductor crystal represented by In$_x$Ga$_y$Al$_z$N, where x+y+z=1, $0 \leq x \leq 1$, $0 \leq y \leq 1$, and $0 \leq z \leq 1$, on the substrate surface on which the particles have been deposited.

2. The method according to claim 1, wherein the substrate is a sapphire (Al$_2$O$_3$) substrate.

3. The method according to claim 1, wherein the group III metal is In$_u$Ga$_v$Al$_w$, where u+v+w=1, $0 \leq u \leq 1$, $0 \leq v \leq 1$, and $0 \leq w \leq 1$.

4. The method according to claim 1, wherein the group III metal particles are deposited by thermal decomposition of metallo-organic material.

5. The method according to claim 1, wherein the first step is performed in an atmosphere containing no nitrogen source.

6. The method according to claim 1 or claim 5, wherein the first step is performed at or above a melting point of the group III metal.

7. The method according to claim 1, wherein the second step is performed in an atmosphere containing no metal material.

8. The method according to claim 1 or claim 7, wherein the second step is performed at or above a temperature used in the first step.

9. The method according to claim 1, wherein the third step is performed at or above a temperature used in the second step.

10. The method according to claim 1, wherein the vapor phase growth method is a metallo-organic chemical vapor deposition method.

11. The method according to claim 1, wherein the group III metal particles nitrided in the second step are polycrystalline and/or noncrystalline group-III nitrides and include unreacted metal.

12. The method according to claim 1, further comprising a step of forming a mask layer on the substrate to grow a gallium nitride-based compound semiconductor crystal, thereby selectively growing the gallium nitride-based compound semiconductor crystal.

13. The method according to claim 12, wherein the mask layer formed on the substrate comprises a first portion and a second portion wherein the growth rate of gallium nitride-based compound semiconductor is higher on the second portion than on the first portion.

14. The method according to claim 12, wherein the step of forming the mask layer is performed in an epitaxial growth apparatus used to grow the gallium nitride-based compound semiconductor crystal.

15. The method according to claim 12, wherein the mask layer is formed by flowing a Si-containing material gas over the substrate.

16. The method according to claim 12, wherein the mask layer is formed by simultaneously flowing a Si-containing material gas and ammonia over the substrate.

17. The method according to claim 12, wherein the mask layer formed includes a portion that covers the substrate and a portion that exposes the substrate.

18. The method according to claim 12, wherein the mask layer is formed by simultaneously flowing a group-III-element-containing material gas and a Si-containing material gas over the substrate.

19. A method of fabricating a group-III nitride semiconductor crystal comprising: a first step of, in an atmosphere containing no nitrogen source, using thermal decomposition of metallo-organic material that includes at least one metal element selected from among In, Ga and Al to deposit on a sapphire substrate a metal material represented by $In_uGa_vAl_w$, where $u+v+w=1$, $0 \leq u \leq 1$, $0 \leq v \leq 1$, and $0 \leq w \leq 1$, at a temperature T1 that is not lower than a melting point of said metal; a second step of nitriding the deposited metal at a temperature T2, where $T2 \geq T1$, in an atmosphere containing a nitrogen source and no metallo-organic material; and a third step of using a metallo-organic chemical vapor deposition method to epitaxially grow on the sapphire substrate on which the metal has been deposited, at a temperature T3, where $T3 \geq T2$, a group-III nitride semiconductor crystal represented by $In_xGa_yAl_z$, where $x+y+z=1$, $0 \leq x \leq 1$, $0 \leq y \leq 1$, and $0 \leq z \leq 1$.

20. The method according to claim 19, wherein the sapphire substrate has a (0001) plane having a vertical axis inclined from <0001> in a specific direction.

21. The method according to claim 20, wherein the specific direction is <1–100> and an angle of inclination from <0001> is from 0.2° to 15°.

22. The method according to claim 19, wherein the temperature T1 is not lower than 900° C. and the temperature T3 is not lower than 1000° C.

23. The method according to claim 19, wherein, the thermal decomposition of metallo-organic material in the first step takes place in a hydrogen atmosphere.

24. The method according to claim 19, wherein the metal is deposited on the sapphire substrate not as a layer but as particles.

25. The method according to claim 24, wherein the metal particles has a height of not less than 50 Å and not more than 1000 Å from the sapphire substrate surface to an apex of the metal particles.

26. The method according to claim 19, wherein the metal nitrided in the second step is comprised of polycrystals which are in a region of $In_uGa_vAl_wN_k$, where $u+v+w=1$, $0 \leq u$, v, $w \leq 1$, $0<k<1$, in which a stoichiometric ratio between the nitrogen and the metal is not 1:1.

27. The method according to claim 19, further comprising a step of forming a mask layer on the substrate to grow a gallium nitride-based compound semiconductor crystal, thereby selectively growing the gallium nitride-based compound semiconductor crystal.

28. The method according to claim 27, wherein the mask layer formed on the substrate comprises a first portion and a second portion wherein the growth rate of gallium nitride-based compound semiconductor is higher on the second portion than on the first portion.

29. The method according to claim 27, wherein the step of forming the mask layer is performed in an epitaxial growth apparatus used to grow the gallium nitride-based compound semiconductor crystal.

30. The method according to claim 27, wherein the mask layer is formed by flowing a Si-containing material gas over the substrate.

31. The method according to claim 27, wherein the mask layer is formed by simultaneously flowing a Si-containing material gas and ammonia over the substrate.

32. The method according to claim 27, wherein the mask layer formed comprises a portion that covers the substrate and a portion that exposes the sapphire substrate.

33. The method according to claim 27, wherein the mask layer is formed by simultaneously flowing a group-III-element-containing material gas and a Si-containing material gas over the substrate.

34. A method of fabricating a group-III nitride semiconductor crystal represented by $In_xGa_yAl_zN$, where $x+y+z=1$, $0 \leq x \leq 1$, $0 \leq y \leq 1$, and $0 \leq z \leq 1$, comprising: a first step of supplying group III metal material to a substrate to deposit the group III metal material and/or decomposition products thereof on the substrate; a second step of heat-treating the substrate in an atmosphere containing a nitrogen source; and a third step of using the group III metal material and nitrogen source to grow a group-III nitride semiconductor crystal on the substrate by a vapor phase method.

35. The method according to claim 34, wherein the group-III nitride semiconductor crystal grown on the substrate has a surface with a (0001) plane having a vertical axis inclined from <0001> in a specific direction.

36. The method according to claim 35, wherein the specific direction is <11–20> and an angle of inclination from <0001> is from 0.2° to 15°.

37. The method according to claim 34, further comprising a step of forming a mask layer on the substrate to grow a gallium nitride-based compound semiconductor crystal, thereby selectively growing the gallium nitride-based compound semiconductor crystal.

38. The method according to claim 37, wherein the mask layer formed on the substrate comprises a first portion and a second portion wherein the growth rate of gallium nitride-based compound semiconductor is higher on the second portion than on the first portion.

39. The method according to claim 37, wherein the step of forming the mask layer is performed in an epitaxial growth apparatus used to grow the gallium nitride-based compound semiconductor crystal.

40. The method according to claim 37, wherein the mask layer is formed by flowing a Si-containing material gas over the substrate.

41. The method according to claim 37, wherein the mask layer is formed by simultaneously flowing a Si-containing material gas and ammonia over the substrate.

42. The method according to claim 37, wherein the mask layer formed comprises a portion that covers the substrate and a portion that exposes the substrate.

43. The method according to claim 37, wherein the mask layer is formed by simultaneously flowing a group-III-element-containing material gas and a Si-containing material gas over the substrate.

44. A method of fabricating a gallium nitride-based compound semiconductor, comprising: a first step of adhering metal nuclei to a substrate; a second step of annealing the metal nuclei; a third step of nitriding the annealed metal nuclei to form growth nuclei; and a fourth step of growing a gallium nitride-based compound on the substrate having the growth nuclei to form and grow a layer of gallium nitride-based compound semiconductor crystal.

45. The method according to claim 44, wherein the substrate is a sapphire substrate.

46. The method according to claim 44, wherein, in the first step, the metal nuclei are adhered to the substrate by flowing a source gas containing vapor of metallo-organic material and no nitrogen source.

47. The method according to claim 46, wherein the metallo-organic material comprises at least one member selected from among a metallo-organic material that contains gallium, a metallo-organic material that contains aluminum and a metallo-organic material that contains indium.

48. The method according to claim 44, wherein, in the second step, the metal nuclei are annealed by flowing just carrier gas containing neither a nitrogen source nor metallo-organic material vapor.

49. The method according to claim 44, wherein, in the third step, the metal nuclei are nitrided by flowing gas containing a nitrogen source and no metallo-organic material vapor.

50. The method according to claim 44, wherein, in the fourth step, the gallium nitride-based compound semiconductor crystal is grown by a metallo-organic chemical vapor deposition method by flowing gas containing both a nitrogen source and vapor of metallo-organic material.

51. The method according to claim 44 or claim 48, wherein the second step is performed at a temperature not lower than a temperature at which the first step is performed.

52. The method according to claim 44 or claim 49, wherein the third step is performed at a temperature not lower than a temperature at which the second step is performed.

53. The method according to claim 44 or claim 50, wherein the fourth step is performed at a temperature not lower than a temperature at which the third step is performed.

54. The method according to claim 44, wherein the third step is performed after alternating the first and second steps two or more times.

55. The method according to claim 44, wherein the fourth step is performed after repeating the first, second and third steps two or more times.

56. The method according to claim 44, wherein the first step comprises two steps, which are a first-stage step of flowing a gas containing vapor of at least one member selected from among metallo-organic material containing aluminum, metallo-organic material containing gallium and metallo-organic material containing indium, and a second-stage step of flowing a gas containing vapor of a different metallo-organic material from that of the first-stage step.

57. The method according to claim 56, wherein the second step is performed after alternating the first-stage and second-stage steps of the first step two or more times.

58. The method according to claim 44, wherein the growth nuclei are substantially trapezoidal nitride semiconductor crystals having a flat apex that is parallel to the substrate and flat sides.

59. The method according to claim 44, further comprising a step of growing a separate layer of gallium nitride-based compound semiconductor crystal on the gallium nitride-based compound semiconductor crystal layer formed in the fourth step.

60. The method according to claim 44, further comprising a step of forming a mask layer on the substrate to grow a gallium nitride-based compound semiconductor crystal at a low growth rate, thereby selectively growing the gallium nitride-based compound semiconductor crystal.

61. The method according to claim 60, wherein the mask layer formed on the substrate comprises a portion comprised of material on which gallium nitride-based compound semiconductor growth rate is low and a portion comprised of material on which gallium nitride-based compound semiconductor growth rate is high.

62. The method according to claim 60, wherein the step of forming the mask layer is performed in an epitaxial growth apparatus used to grow the gallium nitride-based compound semiconductor crystal.

63. The method according to claim 60, wherein the mask layer is formed by flowing a Si-containing material gas over the substrate.

64. The method according to claim 60, wherein the mask layer is formed by simultaneously flowing a Si-containing material gas and ammonia over the substrate.

65. The method according to claim 60, wherein the mask layer formed comprises a portion that covers the substrate and a portion that exposes the substrate.

66. The method according to claim 60, wherein the mask layer is formed by simultaneously flowing a group-III-element-containing material gas and a Si-containing material gas over the substrate.

67. A method of fabricating a gallium nitride-based compound semiconductor comprising: a first step of adhering metal nuclei to a substrate in which the first step comprises two steps, which are a first-stage step of flowing a gas containing vapor of at least one member selected from among metallo-organic material containing aluminum, metallo-organic material containing gallium and metallo-organic material containing indium, and a second-stage step of flowing gas containing vapor of a different metallo-organic material from that of the first-stage step; a second step of nitriding the metal nuclei to form growth nuclei; and a third step of growing a gallium nitride-based compound on the substrate having the growth nuclei to form and grow a layer of gallium nitride-based compound semiconductor crystal.

68. The method according to claim 67, wherein the substrate is a sapphire substrate.

69. The method according to claim 67, wherein the second step is performed after alternating the first-stage and second-stage steps of the first step two or more times.

70. The method according to claim 67, wherein the third step is performed after alternating the first and second steps two or more times.

71. The method according to claim 67, wherein, in the first step, the metal nuclei are adhered to the substrate by flowing a gas containing metallo-organic material vapor and no nitrogen source.

72. The method according to claim 67, wherein, in the second step, the metal nuclei are nitrided by flowing gas containing a nitrogen source and no metallo-organic material vapor.

73. The method according to claim 67, wherein, in the third step, the gallium nitride-based compound semiconductor crystal is grown by a metallo-organic chemical vapor deposition method by flowing gas containing both a nitrogen source and vapor of metallo-organic material.

74. The method according to claim 67 or claim 72, wherein the second step is performed at a temperature not lower than a temperature at which the first step is performed.

75. The method according to claim 67 or 73, wherein the third step is performed at a temperature not lower than a temperature at which the second step is performed.

76. The method according to claim 67, wherein the growth nuclei are substantially trapezoidal group-III nitride semiconductor crystals having a flat apex that is parallel to the substrate and flat sides.

77. The method according to claim 67 further comprising a fourth step of growing a separate layer of gallium nitride-based compound semiconductor crystal on the gallium nitride-based compound semiconductor crystal layer formed in the third step.

78. The method according to claim 67 further comprising a fifth step of forming a mask layer on the substrate to grow a gallium nitride-based compound semiconductor crystal layer at a low growth rate, thereby selectively growing the gallium nitride-based compound semiconductor crystal layer.

79. The method according to claim 78, wherein the mask layer formed on the substrate comprises a portion comprised of material on which gallium nitride-based compound semiconductor growth rate is low and a portion comprised of material on which gallium nitride-based compound semiconductor growth rate is high.

80. The method according to claim 78, wherein the step of forming the mask layer is performed in an epitaxial growth apparatus used to grow the gallium nitride-based compound semiconductor crystal.

81. The method according to claim 78, wherein the mask layer is formed by flowing a Si-containing material gas over the substrate.

82. The method according to claim 78, wherein the mask layer is formed by simultaneously flowing a Si-containing material gas and ammonia over the substrate.

83. The method according to claim 78, wherein the mask layer formed comprises a portion that covers the substrate and a portion that exposes the substrate.

84. The method according to claim 78, wherein the mask layer is formed by simultaneously flowing a group-III-element-containing material gas and a Si-containing material gas over the substrate.

* * * * *

UNITED STATES PATENT AND TRADEMARK OFFICE
CERTIFICATE OF CORRECTION

PATENT NO. : 6,852,161 B2
DATED : February 8, 2005
INVENTOR(S) : Yasuhito Urashima et al.

It is certified that error appears in the above-identified patent and that said Letters Patent is hereby corrected as shown below:

Title page,
Item [60], Related U.S. Application Data, please delete "Provisional application No. 60/269,852, filed on Feb. 21,2001, provisional application No. 60/276,116, filed on Mar. 16, 2001, and provisional application No. 60/254,898, filed on Dec. 13, 2000." and insert -- Provisional application No. 60/269,852, filed on Feb. 21, 2001, provisional application No. 60/276,116, filed on Mar. 16, 2001, provisional application No. 60/254,898, filed on Dec. 13, 2000, and provisional application No. 60/254,895, filed on Dec. 13, 2000. --.

Signed and Sealed this

Sixth Day of September, 2005

JON W. DUDAS
*Director of the United States Patent and Trademark Office*